United States Patent
Wu et al.

(10) Patent No.: US 9,761,189 B2
(45) Date of Patent: Sep. 12, 2017

(54) DISPLAY PANEL

(71) Applicant: Au Optronics Corporation, Hsinchu (TW)

(72) Inventors: Hsin-Ying Wu, Yilan County (TW); Chih-Chieh Wang, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/297,643

(22) Filed: Jun. 6, 2014

(65) Prior Publication Data

US 2015/0228237 A1   Aug. 13, 2015

(30) Foreign Application Priority Data

Feb. 12, 2014   (TW) .............................. 103104604 A

(51) Int. Cl.
| | |
|---|---|
| *G09G 3/36* | (2006.01) |
| *H01L 21/04* | (2006.01) |
| *H01L 21/28* | (2006.01) |
| *H01L 31/18* | (2006.01) |
| *H01L 33/38* | (2010.01) |
| *H01L 49/02* | (2006.01) |
| *H01L 31/0224* | (2006.01) |

(52) U.S. Cl.
CPC ....... *G09G 3/3648* (2013.01); *G09G 2310/06* (2013.01); *H01L 21/0425* (2013.01); *H01L 21/28* (2013.01); *H01L 28/60* (2013.01); *H01L 31/0224* (2013.01); *H01L 31/1884* (2013.01); *H01L 33/387* (2013.01)

(58) Field of Classification Search
CPC ............ G09G 2300/023; G02F 1/1347; G02F 1/136286; G02F 1/13621; G02F 2413/155; G02F 2001/13621; G02F 2001/1357; G02F 2001/13331; G02F 2001/134345; G06F 3/1423; H04N 13/0497
USPC ..... 345/4–6, 50, 60, 64, 87–104, 38–40, 55; 349/29, 42–52, 147
See application file for complete search history.

(56) References Cited

U.S. PATENT DOCUMENTS

| | | | |
|---|---|---|---|
| 7,760,303 B2 | 7/2010 | Jang et al. | |
| 8,508,434 B2* | 8/2013 | Hillis | G09G 3/2085 257/88 |
| 8,823,892 B2* | 9/2014 | Kim | G02F 1/134363 349/139 |
| 2007/0153188 A1 | 7/2007 | Jang et al. | |

(Continued)

FOREIGN PATENT DOCUMENTS

CN   1991550   7/2007

*Primary Examiner* — Vinh Lam
(74) *Attorney, Agent, or Firm* — Jianq Chyun IP Office

(57) ABSTRACT

A display panel including a first pixel array, a second pixel array and a display medium therebetween is provided. The first pixel array includes a plurality of first pixel sets, and the second pixel array includes a plurality of second pixel sets. The second pixel array is disposed overlapping the first pixel array, and the display medium is disposed between the first pixel array and the second pixel array. A display unit set is constituted by each of the first pixel sets, one of the second pixel sets disposed overlapping the each of the first pixel sets and the display medium disposed between the first pixel set and the second pixel set, and the display unit set includes a plurality of display units.

29 Claims, 16 Drawing Sheets

(56) References Cited

U.S. PATENT DOCUMENTS

| | | | |
|---|---|---|---|
| 2009/0032680 A1* | 2/2009 | Watanabe | H01L 27/14658 250/208.1 |
| 2010/0090936 A1* | 4/2010 | Dupuy | G09G 3/3607 345/88 |
| 2010/0276736 A1* | 11/2010 | Bocko | H01L 27/14632 257/291 |
| 2011/0285610 A1* | 11/2011 | Yan | G09G 3/20 345/55 |
| 2012/0007899 A1* | 1/2012 | Kuijpers | G09G 3/003 345/690 |
| 2012/0026151 A1* | 2/2012 | Kim | G09G 3/3614 345/212 |
| 2012/0033161 A1 | 2/2012 | Han et al. | |
| 2012/0062527 A1* | 3/2012 | Cheong | G02F 1/1347 345/204 |
| 2012/0193689 A1* | 8/2012 | Park | H01L 27/307 257/290 |
| 2012/0268356 A1* | 10/2012 | Kim | G02F 1/13338 345/84 |
| 2013/0088621 A1* | 4/2013 | Hamada | H04N 5/3696 348/281 |
| 2013/0120466 A1* | 5/2013 | Chen | G09G 3/3648 345/690 |
| 2013/0222219 A1* | 8/2013 | Saitoh | H01L 27/1222 345/89 |
| 2013/0234954 A1* | 9/2013 | Koide | G06F 3/0488 345/173 |
| 2013/0271436 A1* | 10/2013 | Shiomi | G09G 3/3648 345/204 |
| 2014/0078035 A1* | 3/2014 | Sato | G09G 3/344 345/107 |
| 2015/0241744 A1* | 8/2015 | Nakata | H01L 27/0296 349/42 |

* cited by examiner

DISPLAY PANEL

CROSS-REFERENCE TO RELATED APPLICATION

This application claims the priority benefit of Taiwan application serial no. 103104604, filed on Feb. 12, 2014. The entirety of the above-mentioned patent application is hereby incorporated by reference herein and made a part of this specification.

BACKGROUND OF THE INVENTION

Field of the Invention

The invention relates to a display panel, and more particularly, to a display panel including two pixel arrays.

Description of Related Art

With the progress of science and technology, cathode ray tube (CRT) displays having a large volume have gradually become history. Accordingly, display panels such as liquid crystal displays (LCDs), organic light-emitting diode (OLED) displays, electro-phoretic displays (EPDs) and plasma display panels (PDPs) are becoming the mainstream of displays in the future.

In a conventional liquid crystal display panel, each pixel includes an active device. Thus, with a premise that a driving circuit (including a scan line and a data line) has constant line widths, when the panel resolution is increased, problems of a decrease in pixel aperture ratio and an increase in load on the driving circuit occur as a result. Further, if the line width or number of the driving circuit has to be increased due to an increase in pixel number, so as to reduce the load on the driving circuit, the pixel aperture ratio will become even lower, and the display quality will be affected. Therefore, to develop a display panel having a high pixel aperture ratio is definitely one of the goals pursued by researchers and developers.

SUMMARY OF THE INVENTION

The invention provides a display panel having an improved pixel aperture ratio.

The invention proposes a display panel including a first pixel array, a second pixel array and a display medium. The first pixel array includes a plurality of first pixel sets. The second pixel array includes a plurality of second pixel sets. The second pixel array is disposed overlapping the first pixel array. The display medium is located between the first pixel array and the second pixel array. Each first pixel set, one of the second pixel sets disposed overlapping the first pixel set, and the display medium disposed between the first pixel set and the second pixel set constitute a display unit set, and the display unit set includes a plurality of display units.

Based on the above, in the display panel of the invention, since the second pixel sets are disposed overlapping the first pixel sets, the design of the display unit set of the invention decreases the area for the active devices required to be disposed in a display region, thereby increasing a pixel aperture ratio.

To make the above features and advantages of the invention more comprehensible, embodiments accompanied with drawings are described in detail as follows.

DETAILED DESCRIPTION OF DISCLOSED EMBODIMENTS

Figure 1:
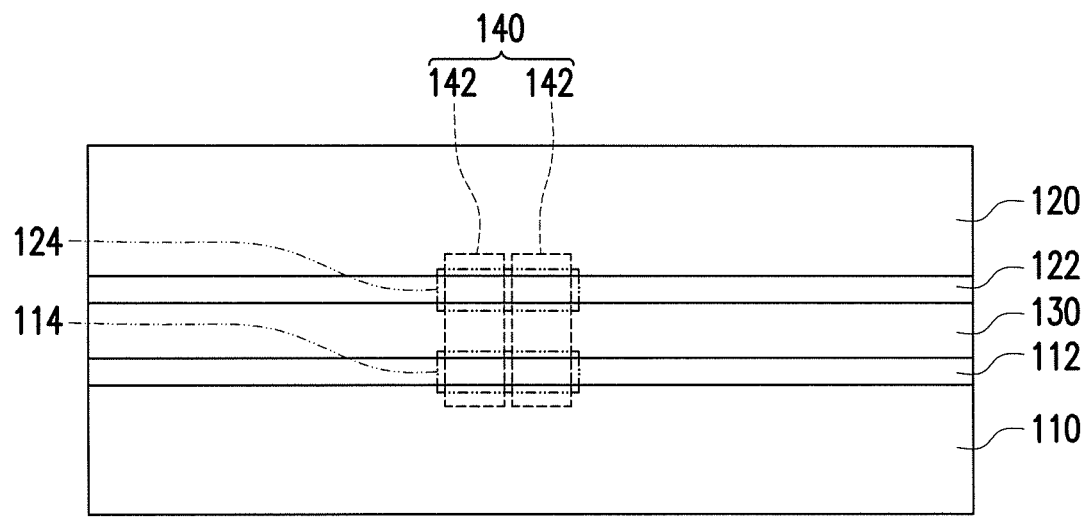
FIG. 1 is a schematic cross-sectional view of a display panel according to the invention.

FIG. 1 is a schematic cross-sectional view of a display panel according to the invention. In the present embodiment, a display panel 100 is, for example, a liquid crystal display panel or other suitable display panel. In the following, the embodiments of the invention provide an example where the display panel 100 is a liquid crystal display panel.

Referring to FIG. 1, the display panel 100 includes a first substrate 110, a first pixel array 112, a second substrate 120, a second pixel array 122 and a display medium 130.

A material of the first substrate 110 includes glass, quartz, organic polymer or metal, etc. The first substrate 110 includes the first pixel array 112 disposed thereon. The first pixel array 112 consists of a plurality of first pixel sets 114 (i.e. the first pixel array 112 includes a plurality of first pixel sets 114), and a design of the first pixel set 114 will be described in detail later.

The second substrate 120 is located opposite to the first substrate 110. A material of the second substrate 120 includes glass, quartz or organic polymer, etc. According to another embodiment of the invention, the second substrate 120 further includes a color filter array layer (not illustrated) disposed thereon, and the color filter array layer includes filter patterns of red, green and blue. In addition, the second substrate 120 further includes a light shielding pattern layer (not illustrated) disposed thereon. The light shielding pattern layer, also known as a black matrix, is disposed between the patterns of the color filter array layer. Moreover, in the present embodiment, the second substrate 120 includes the second pixel array 122 disposed thereon, and the second pixel array 122 is disposed overlapping the first pixel array 112. The second pixel array 122 consists of a plurality of second pixel sets 124 (i.e. the second pixel array 122 includes a plurality of second pixel sets 124), and a design of the second pixel set 124 will be described in detail later.

The display medium 130 is located between the first pixel array 112 on the first substrate 110 and the second pixel array 122 on the second substrate 120. In the present embodiment, when the display panel 100 is a liquid crystal display panel, the display medium 130 includes a plurality of liquid crystal molecules (not illustrated).

In the present embodiment, each first pixel set 114, one of the second pixel sets 124 disposed overlapping the first pixel set 114 and the display medium 130 located between the first pixel set 114 and the second pixel set 124 constitute a display unit set 140. The display unit set 140 includes a plurality of display units 142, and a design of the display unit set 140 will be described in detail later.

In the following, the display unit set 140, the first pixel set 114 and the second pixel set 124 according to the invention will be described in detail.

Figure 2A:
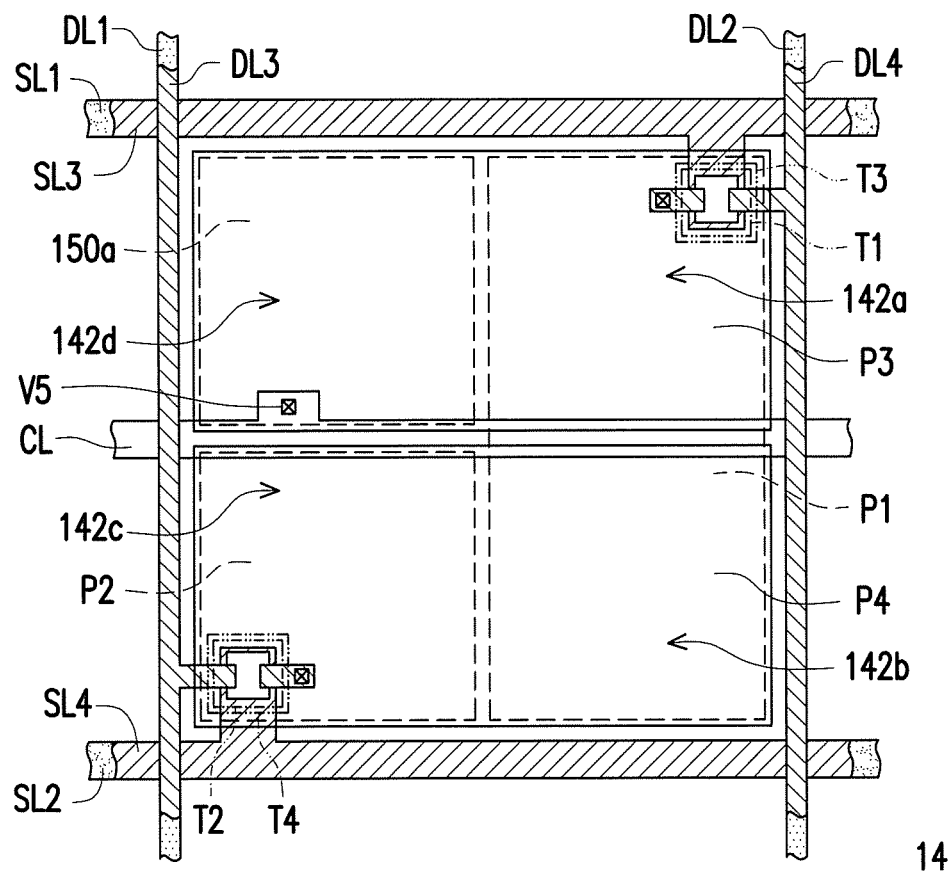
FIGS. 2A to 2C are schematic top views of, respectively, a display unit set, a first pixel set and a second pixel set according to the first embodiment of the invention.
Figure 2B:
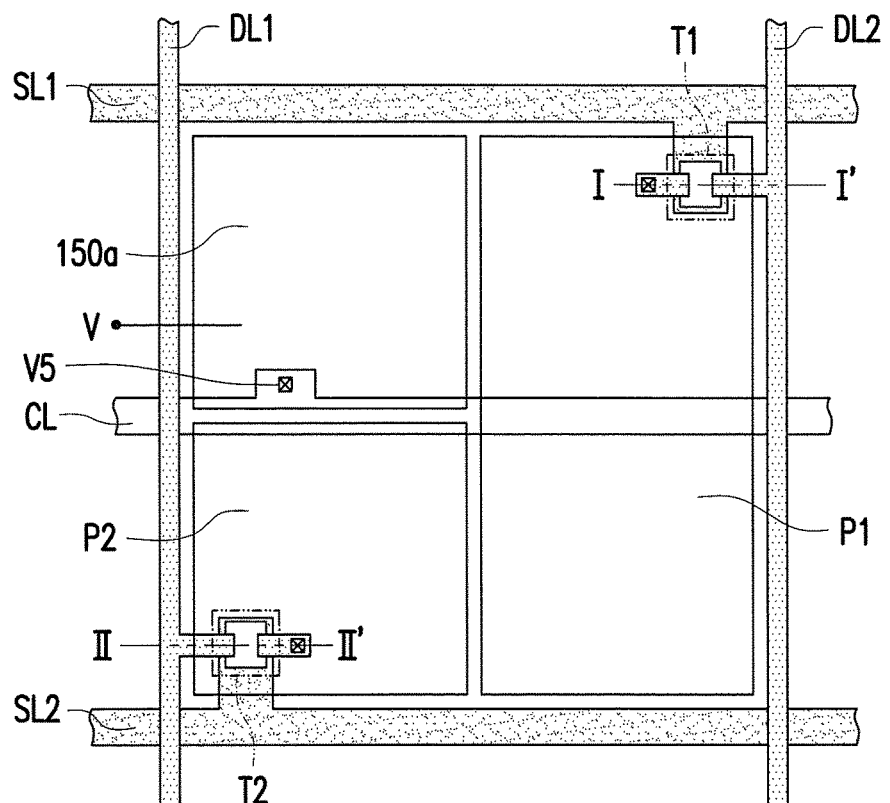
Figure 2C:
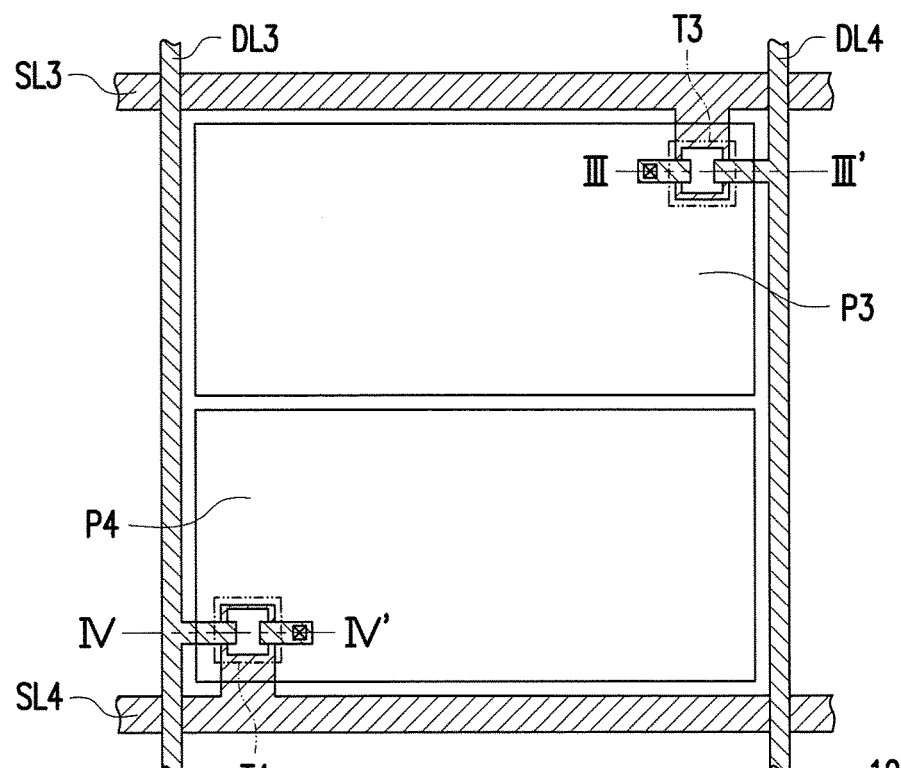
Figure 3A:
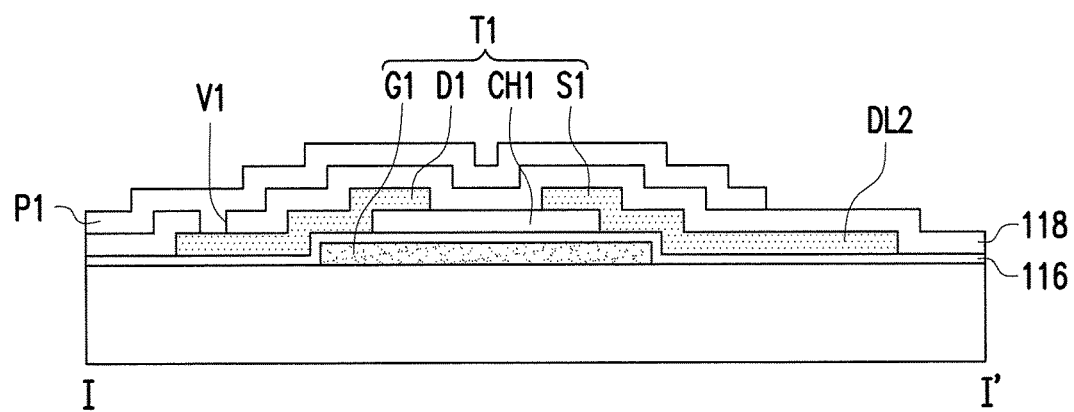
FIGS. 3A and 3B are schematic cross-sectional views of an active device along, respectively, lines I-I' and II-II' in FIG. 2B.
Figure 3B:
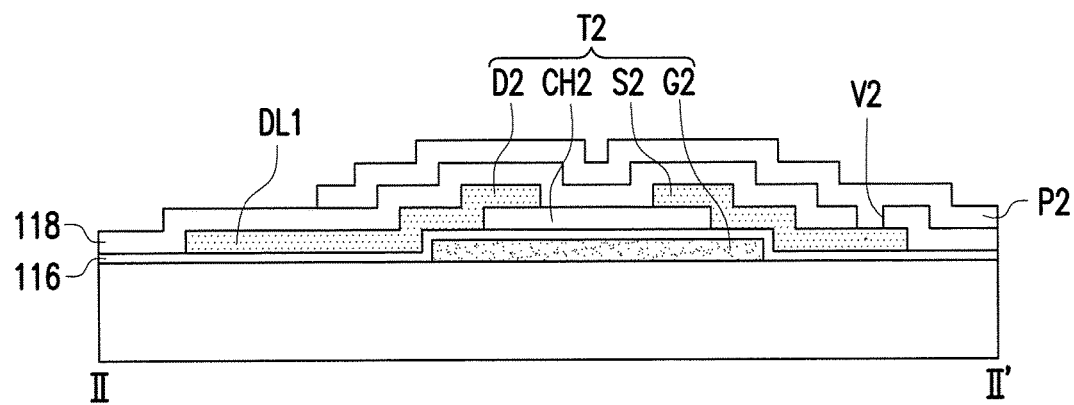
Figure 3C:
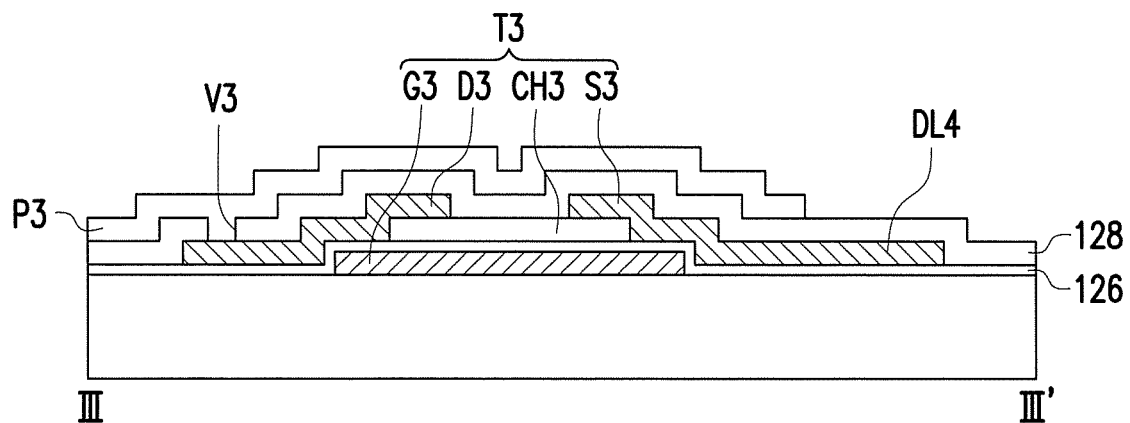
FIGS. 3C and 3D are schematic cross-sectional views of an active device along, respectively, lines III-III' and IV-IV' in FIG. 2C.
Figure 3D:
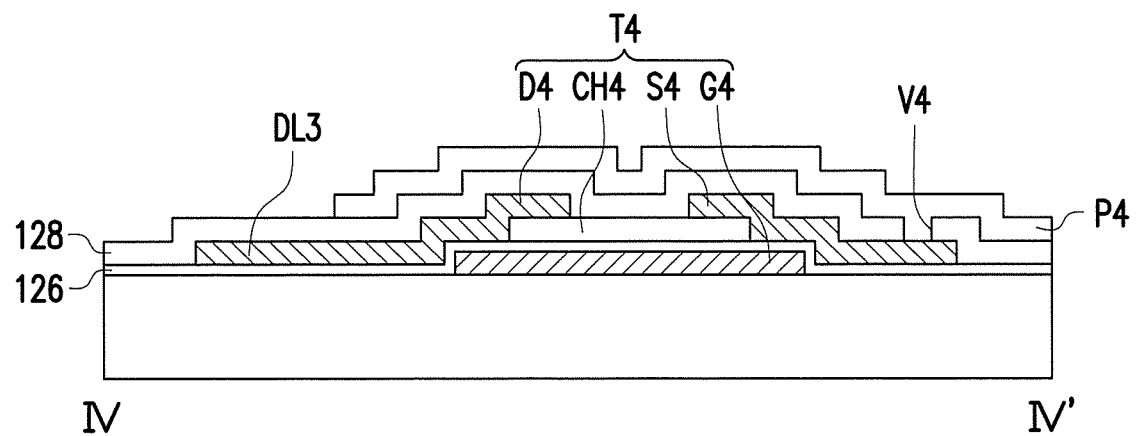

FIGS. 2A to 2C are schematic top views of, respectively, the display unit set 140, the first pixel set 114 and the second pixel set 124 according to the first embodiment of the invention. To enable a clear description of the embodiments of the invention, FIG. 2A only illustrates one of the display unit sets 140 of the display panel 100, FIG. 2B only illustrates one of the first pixel sets 114 of the first pixel array 112 in FIG. 1, and FIG. 2C only illustrates one of the second pixel sets 124 of the second pixel array 122 in FIG. 1. It should be understood by persons skilled in the art that the display panel 100 in FIG. 1 is actually formed by arranging a plurality of the display unit sets 140 shown in FIG. 2A in an array, the first pixel array 112 in FIG. 1 is actually formed by arranging a plurality of the first pixel sets 114 shown in FIG. 2B in an array, and the second pixel array 122 in FIG. 1 is actually formed by arranging a plurality of the second pixel sets 124 shown in FIG. 2C in an array. In other words, the display unit set 140 shown in FIG. 2A is actually constituted by the first pixel set 114 shown in FIG. 2B, the second pixel set 124 disposed overlapping the first pixel set 114 and shown in FIG. 2C, and the display medium 130 located between the first pixel set 114 and the second pixel set 124. To enable a clear description of the embodiments of the invention, the display medium 130 is omitted from FIG. 2A. In addition, FIGS. 3A and 3B are schematic cross-sectional views of an active device along, respectively, lines I-I' and II-II' in FIG. 2B, and FIGS. 3C and 3D are schematic cross-sectional views of an active device along, respectively, lines III-III' and IV-IV' in FIG. 2C.

Referring to FIGS. 2A to 3D together, each first pixel set 114 includes a first scan line SL1, a second scan line SL2, a first data line DL1, a second data line DL2, a first active device T1, a second active device T2, a first pixel electrode P1, a second pixel electrode P2 and a first independent electrode 150a.

Extension directions of the first scan line SL1 and the second scan line SL2 are parallel to each other, and extension directions of the first data line DL1 and the second data line DL2 are parallel to each other. Moreover, the extension directions of the scan lines SL1 to SL2 are different from those of the data lines DL1 to DL2. It is preferable that the extension directions of the scan lines SL1 to SL2 are perpendicular to those of the data lines DL1 to DL2. In addition, the scan lines SL1 to SL2 and the data lines DL1 to DL2 are in different layers, and sandwich an insulating layer (not illustrated) therebetween. The scan lines SL1 to SL2 and the data lines DL1 to DL2 are mainly configured to transmit a driving signal for driving this first pixel set 114. Generally, the scan lines SL1 to SL2 and the data lines DL1 to DL2 are made of metal materials. However, the invention is not limited thereto. According to other embodiments, the scan lines SL1 to SL2 and the data lines DL1 to DL2 may also be made of other conductive materials, such as alloys, oxides of metal materials, nitrides of metal materials, nitrogen oxides of metal materials or stacked layers of metal materials and other conductive materials.

The first active device T1 is electrically connected to the first scan line SL1 and the second data line DL2, and the second active device T2 is electrically connected to the second scan line SL2 and the first data line DL1. Here, the active devices T1 and T2 are, for example, thin-film transistors. The first active device T1 includes a gate G1, a channel layer CH1, a drain D1 and a source S1. The second active device T2 includes a gate G2, a channel layer CH2, a drain D2 and a source S2. The gate G1 is electrically connected to the first scan line SL1, the gate G2 is electrically connected to the second scan line SL2, the source S1 is electrically connected to the second data line DL2, and the source S2 is electrically connected to the first data line DL1. In other words, when a control signal is input into the scan lines SL1 to SL2, the first scan line SL1 and the gate G1 are electrically conducted to each other, and the second scan line SL2 and the gate G2 are electrically conducted to each other; when a control signal is input into the data lines DL1 to DL2, the second data line DL2 and the source S1 are conducted to each other, and the first data line DL1 and the source S2 are conducted to each other. The channel layer CH1 is located above the gate G1 and below the source S1 and the drain D1, and the channel layer CH2 is located above the gate G2 and below the source S2 and the drain D2. The present embodiment provides an example where the active devices T1 and T2 are bottom-gate thin-film transistors. However, the invention is not limited thereto. In other embodiments, the active devices T1 and T2 may be top-gate thin-film transistors.

An insulating layer 116 further covers the gates G1 and G2 of the active devices T1 and T2, and the insulating layer 116 is also known as a gate insulating layer. In addition, another insulating layer 118 further covers the active devices T1 and T2, and is also known as a protection layer. Materials of the insulating layers 116 and 118 include, for example, an inorganic material, an organic material, or a combination thereof. The inorganic material includes, for example, silicon oxide, silicon nitride, silicon oxynitride, or a stacked layer of at least two of the above materials.

The first pixel electrode P1 is electrically connected to the first active device T1, and the second pixel electrode P2 is electrically connected to the second active device T2. More specifically, the first pixel electrode P1 is electrically connected to the drain D1 of the first active device T1 via a contact V1, and the second pixel electrode P2 is electrically connected to the drain D2 of the second active device T2 via a contact V2. The first pixel electrode P1 and the second pixel electrode P2 are, for example, transparent conductive layers, and include a metal oxide, such as indium tin oxide, indium zinc oxide, aluminum tin oxide, aluminum zinc oxide, indium germanium zinc oxide or other suitable oxide, or a stacked layer of at least two of the above.

The first independent electrode 150a is electrically connected to a constant voltage V. The first independent electrode 150a is, for example, a transparent conductive layer, and includes a metal oxide, such as indium tin oxide, indium zinc oxide, aluminum tin oxide, aluminum zinc oxide, indium germanium zinc oxide or other suitable oxide, or a stacked layer of at least two of the above. The constant voltage V is, for example, a common voltage or other suitable constant voltage. For example, the first independent electrode 150*a* is electrically connected to a common line CL via a contact V5, so as to be electrically connected to the constant voltage V. The common line CL is, for example, in the same layer as the scan lines SL1 to SL2. In the present embodiment, the common line CL is, for example, disposed parallel to the scan lines SL1 to SL2. However, the invention is not limited thereto. In other embodiments, the common line CL may be disposed parallel to the data lines DL1 to DL2 or arranged in other suitable manners.

Each second pixel set 124 includes a third scan line SL3, a fourth scan line SL4, a third data line DL3, a fourth data line DL4, a third active device T3, a fourth active device T4, a third pixel electrode P3 and a fourth pixel electrode P4.

Extension directions of the third scan line SL3 and the fourth scan line SL4 are parallel to each other, and extension directions of the third data line DL3 and the fourth data line DL4 are parallel to each other. Moreover, the extension directions of the scan lines SL3 to SL4 are different from those of the data lines DL3 to DL4. It is preferable that the extension directions of the scan lines SL3 to SL4 are perpendicular to those of the data lines DL3 to DL4. In addition, the scan lines SL3 to SL4 and the data lines DL3 to DL4 are in different layers, and sandwich an insulating layer (not illustrated) therebetween. The scan lines SL3 to SL4 and the data lines DL3 to DL4 are mainly configured to transmit a driving signal for driving this second pixel set 124. Generally, the scan lines SL3 to SL4 and the data lines DL3 to DL4 are made of metal materials. However, the invention is not limited thereto. According to other embodiments, the scan lines SL3 to SL4 and the data lines DL3 to DL4 may also be made of other conductive materials, such as alloys, oxides of metal materials, nitrides of metal materials, nitrogen oxides of metal materials or stacked layers of metal materials and other conductive materials.

The third active device T3 is electrically connected to the third scan line SL3 and the fourth data line DL4, and the fourth active device T4 is electrically connected to the fourth scan line SL4 and the third data line DL3. Here, the active devices T3 and T4 are, for example, thin-film transistors. The third active device T3 includes a gate G3, a channel layer CH3, a drain D3 and a source S3. The fourth active device T4 includes a gate G4, a channel layer CH4, a drain D4 and a source S4. The gate G3 is electrically connected to the third scan line SL3, the gate G4 is electrically connected to the fourth scan line SL4, the source S3 is electrically connected to the fourth data line DL4, and the source S4 is electrically connected to the third data line DL3. In other words, when a control signal is input into the scan lines SL3 to SL4, the third scan line SL3 and the gate G3 are electrically conducted to each other, and the fourth scan line SL4 and the gate G4 are electrically conducted to each other; when a control signal is input into the data lines DL3 to DL4, the fourth data line DL4 and the source S3 are conducted to each other, and the third data line DL3 and the source S4 are conducted to each other. The channel layer CH3 is located above the gate G3 and below the source S3 and the drain D3, and the channel layer CH4 is located above the gate G4 and below the source S4 and the drain D4. The present embodiment provides an example where the active devices T3 and T4 are bottom-gate thin-film transistors. However, the invention is not limited thereto. In other embodiments, the active devices T3 and T4 may be top-gate thin-film transistors.

An insulating layer 126 further covers the gates G3 and G4 of the active devices T3 and T4, and the insulating layer 126 is also known as a gate insulating layer. In addition, another insulating layer 128 further covers the active devices T3 and T4, and the insulating layer 128 is also known as a protection layer. Materials of the insulating layers 126 and 128 include, for example, an inorganic material, an organic material, or a combination thereof. The inorganic material includes, for example, silicon oxide, silicon nitride, silicon oxynitride, or a stacked layer of at least two of the above materials.

The third pixel electrode P3 is electrically connected to the third active device T3, and the fourth pixel electrode P4 is electrically connected to the fourth active device T4. More specifically, the third pixel electrode P3 is electrically connected to the drain D3 of the third active device T3 via a contact V3, and the fourth pixel electrode P4 is electrically connected to the drain D4 of the fourth active device T4 via a contact V4. The third pixel electrode P3 and the fourth active device T4 are, for example, transparent conductive layers, and include a metal oxide, such as indium tin oxide, indium zinc oxide, aluminum tin oxide, aluminum zinc oxide, indium germanium zinc oxide or other suitable oxide, or a stacked layer of at least two of the above.

It is worth mentioning that the first pixel electrode P1 overlaps the third pixel electrode P3 to constitute a first display unit 142*a*, the first pixel electrode P1 overlaps the fourth pixel electrode P4 to constitute a second display unit 142*b*, the second pixel electrode P2 overlaps the fourth pixel electrode P4 to constitute a third display unit 142*c*, and the first independent electrode 150*a* overlaps the third pixel electrode P3 to constitute a fourth display unit 142*d*. Since voltages of the pixel electrodes P1 to P4 are respectively controlled by the active devices T1 to T4, and a voltage of the first independent electrode 150*a* is the constant voltage V, by an overlap of the first pixel set 114 and the second pixel set 124, the display unit set 140 has the four display units 142*a* to 142*d* having different voltage differences. In this way, the four display units 142*a* to 142*d* display different gray levels. Moreover, in the present embodiment, a sum of an area of the second pixel electrode P2 and an area of the first independent electrode 150*a* is equivalent to an area of the first pixel electrode P1. An area of the third pixel electrode P3 is equivalent to an area of the fourth pixel electrode P4. Accordingly, on a display face, the four display units 142*a* to 142*d* have the same area.

It is also worth mentioning that in a conventional liquid crystal display panel, each pixel includes an active device, so that four pixels on a display face include four active device regions, thus resulting in a lower pixel aperture ratio. However, in the present embodiment, referring to FIG. 2A, the third scan line SL3 overlaps the first scan line SL1, the fourth scan line SL4 overlaps the second scan line SL2, the third data line DL3 overlaps the first data line DL1, and the fourth data line DL4 overlaps the second data line DL2. Moreover, the third active device T3 overlaps the first active device T1, and the fourth active device T4 overlaps the second active device T2. That is to say, in the present embodiment, the display unit set 140 has the four display units 142*a* to 142*d*, each of the display units being equivalent to a sub-pixel. Moreover, the design of the display unit set 140 of the invention makes it possible that the display unit set 140 constituted by the four sub-pixels only requires two active device regions on the display surface, wherein the third active device T3 overlaps the first active device T1, and the fourth active device T4 overlaps the second active device T2. Hence, the design of the display unit set 140 of the invention decreases the number of active device regions required to be disposed on the display surface, so as to increase the pixel aperture ratio.

In the aforementioned embodiments of FIGS. 2A to 3D, the example is given in which each first pixel set 114 includes one independent electrode 150a, and the four display units 142a to 142d have the same area and are of a square shape. However, the invention is not limited thereto. In other embodiments, the invention is satisfied as long as each first pixel set 114 or each second pixel set 124 includes at least one independent electrode to form the four display units 142a to 142d having different voltage differences. For example, in another embodiment, each second pixel set 124 may include one independent electrode, while the first pixel set 114 includes no independent electrode. In addition, in other embodiments, each first pixel set 114 or each second pixel set 124 may include at least two independent electrodes, or the four display units 142a to 142d may have different areas or be of other suitable shapes and in other suitable arrangements. A detailed description is as follows. Moreover, to enable a clear description of the embodiments of the invention, the common line CL and the contact V5 will not be illustrated for the following embodiments, and will be represented simply by the electric connection to the constant voltage V. FIGS. 2A and 2B may be referred to for the arrangement of the common line CL and the contact V5. However, the invention is not limited thereto.

Figure 4A:
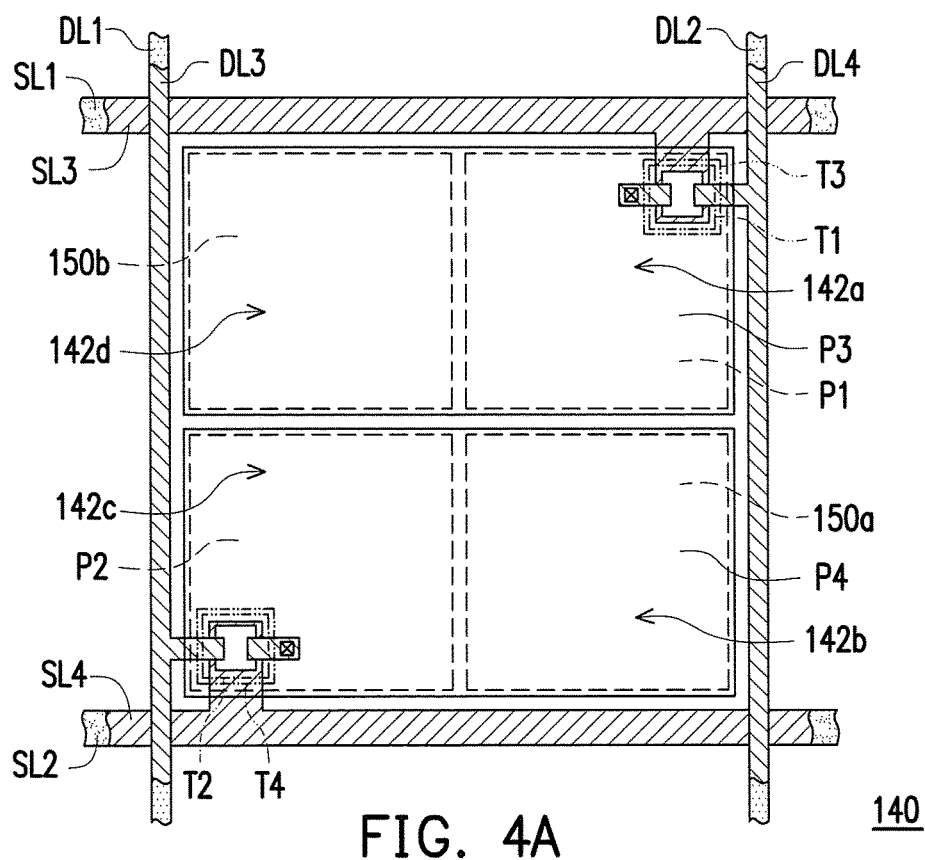
FIGS. 4A to 4C are schematic top views of, respectively, a display unit set, a first pixel set and a second pixel set according to the second embodiment of the invention.
Figure 4B:
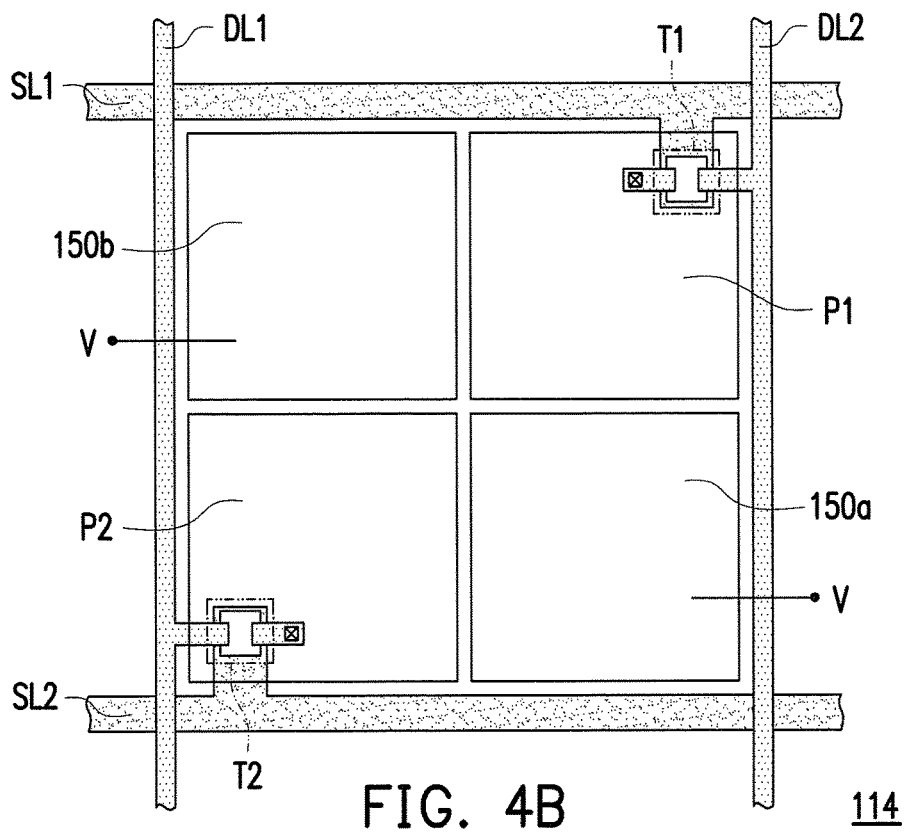
Figure 4C:
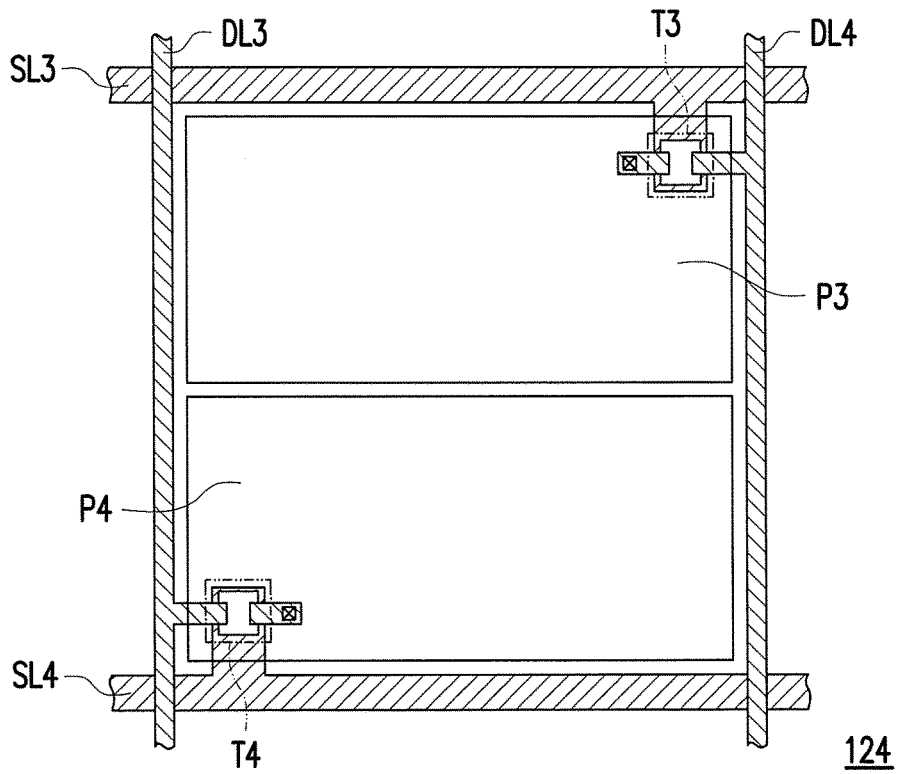

FIGS. 4A to 4C are schematic top views of, respectively, the display unit set 140, the first pixel set 114 and the second pixel set 124 according to the second embodiment of the invention. The embodiments of FIGS. 4A to 4C are similar to those of FIGS. 2A to 2C. Thus, the same or similar elements are represented by the same or similar reference numerals, and descriptions thereof are not repeated herein.

Referring to FIGS. 4A to 4C, the embodiments of FIGS. 4A to 4C differ from those of FIGS. 2A to 2C in that the number of independent electrodes included in the first pixel set 114 is different. Each first pixel set 114 includes two independent electrodes, the independent electrodes being not adjacent to each other. However, the invention is not limited thereto. In other embodiments, it may be each second pixel set 124 that includes two independent electrodes and the independent electrodes are not adjacent to each other. More specifically, in the present embodiment, the first pixel set 114 includes the first independent electrode 150a and a second independent electrode 150b. The first independent electrode 150a and the second independent electrode 150b are electrically connected to a constant voltage, or are respectively electrically connected to corresponding constant voltages. In other words, the first independent electrode 150a and the second independent electrode 150b may be electrically connected to the same constant voltage or different constant voltages. In this way, the first pixel electrode P1 overlaps the third pixel electrode P3 to constitute the first display unit 142a, the first independent electrode 150a overlaps the fourth pixel electrode P4 to constitute the second display unit 142b, the second pixel electrode P2 overlaps the fourth pixel electrode P4 to constitute the third display unit 142c, and the second independent electrode 150b overlaps the third pixel electrode P3 to constitute the fourth display unit 142d. Moreover, the area of the first pixel electrode P1, the area of the second pixel electrode P2, the area of the first independent electrode 150a and an area of the second independent electrode 150b are substantially the same. The area of the third pixel electrode P3 is equivalent to the area of the fourth pixel electrode P4.

Figure 5A:
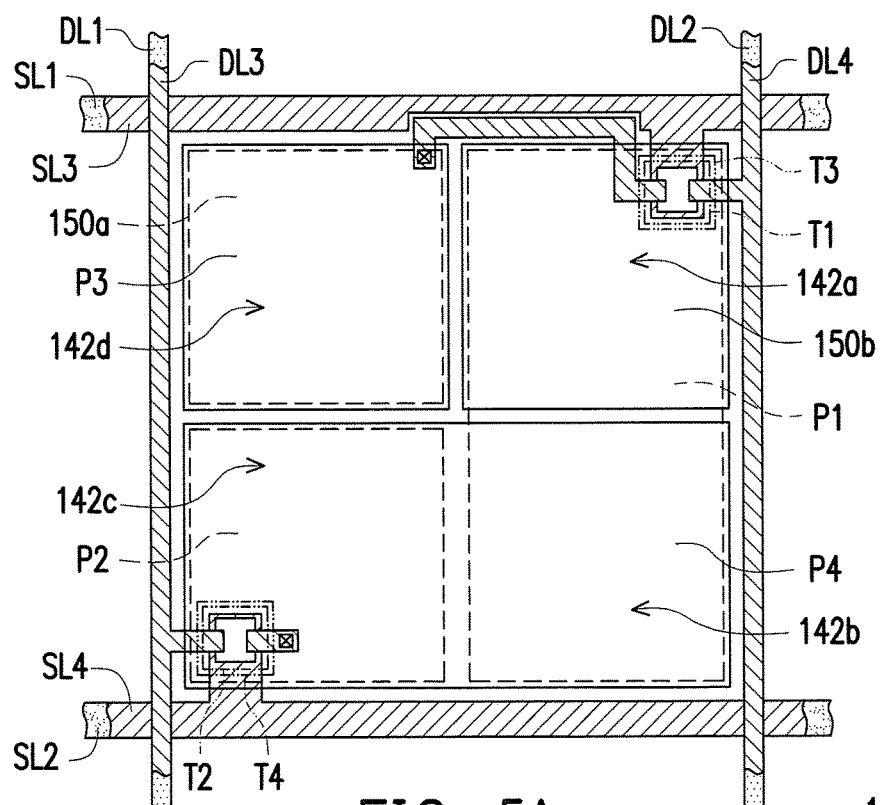
FIGS. 5A to 5C are schematic top views of respectively, a display unit set, a first pixel set and a second pixel set according to the third embodiment of the invention.
Figure 5B:
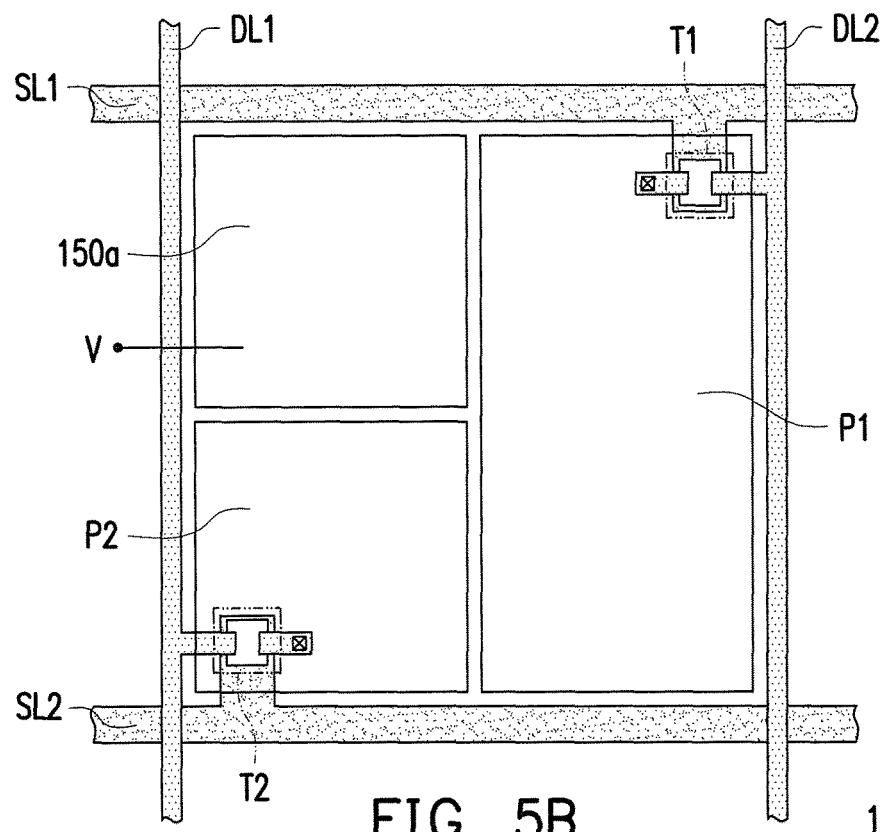
Figure 5C:
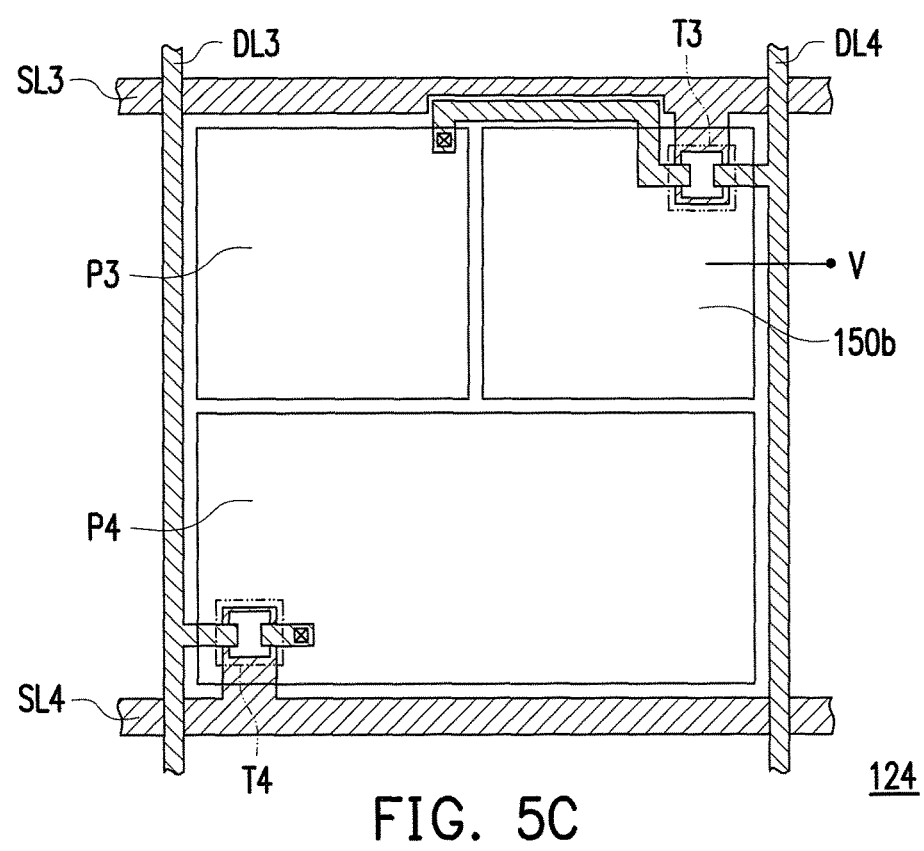

FIGS. 5A to 5C are schematic top views of respectively, the display unit set 140, the first pixel set 114 and the second pixel set 124 according to the third embodiment of the invention. The embodiments of FIGS. 5A to 5C are similar to those of FIGS. 2A to 2C. Thus, the same or similar elements are represented by the same or similar reference numerals, and descriptions thereof are not repeated herein.

Referring to FIGS. 5A to 5C, the embodiments of FIGS. 5A to 5C differ from those of FIGS. 2A to 2C in that the second pixel set 124 further includes another independent electrode. More specifically, in the present embodiment, the first pixel set 114 and the second pixel set 124 include the first independent electrode 150a and the second independent electrode 150b respectively, and the first independent electrode 150a and the second independent electrode 150b neither overlap nor are adjacent to each other. The first independent electrode 150a and the second independent electrode 150b are electrically connected to a constant voltage, or are respectively electrically connected to corresponding constant voltages. In other words, the first independent electrode 150a and the second independent electrode 150b may be electrically connected to the same constant voltage or different constant voltages. In this way, the first pixel electrode P1 overlaps the second independent electrode 150b to constitute the first display unit 142a, the first pixel electrode P1 overlaps the fourth pixel electrode P4 to constitute the second display unit 142b, the second pixel electrode P2 overlaps the fourth pixel electrode P4 to constitute the third display unit 142c, and the first independent electrode 150a overlaps the third pixel electrode P3 to constitute the fourth display unit 142d. Moreover, a sum of the area of the second pixel electrode P2 and the area of the first independent electrode 150a is equivalent to the area of the first pixel electrode P1. A sum of the area of the third pixel electrode P3 and the area of the second independent electrode 150b is equivalent to the area of the fourth pixel electrode P4.

Figure 6A:
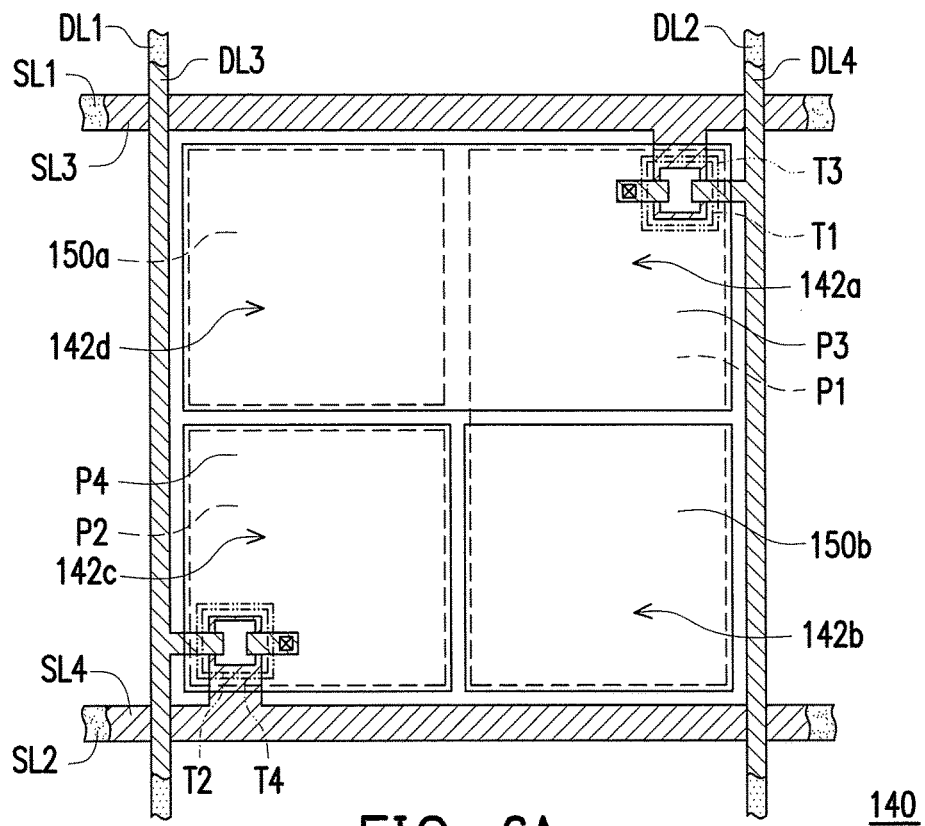
FIGS. 6A to 6C are schematic top views of, respectively, a display unit set, a first pixel set and a second pixel set according to the fourth embodiment of the invention.
Figure 6B:
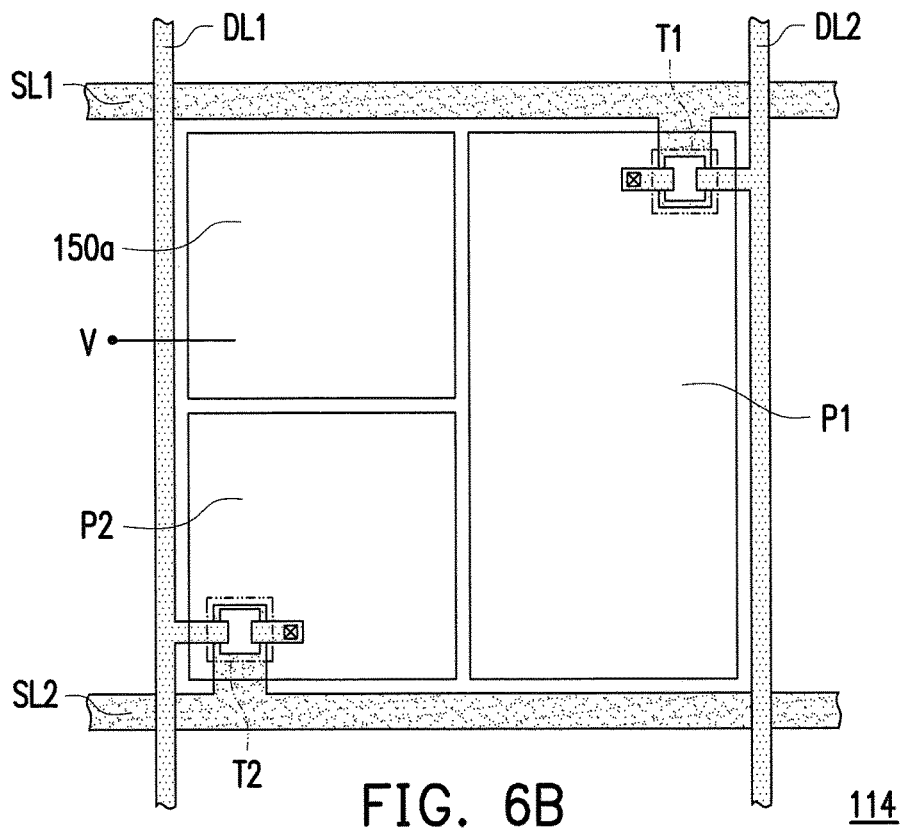
Figure 6C:
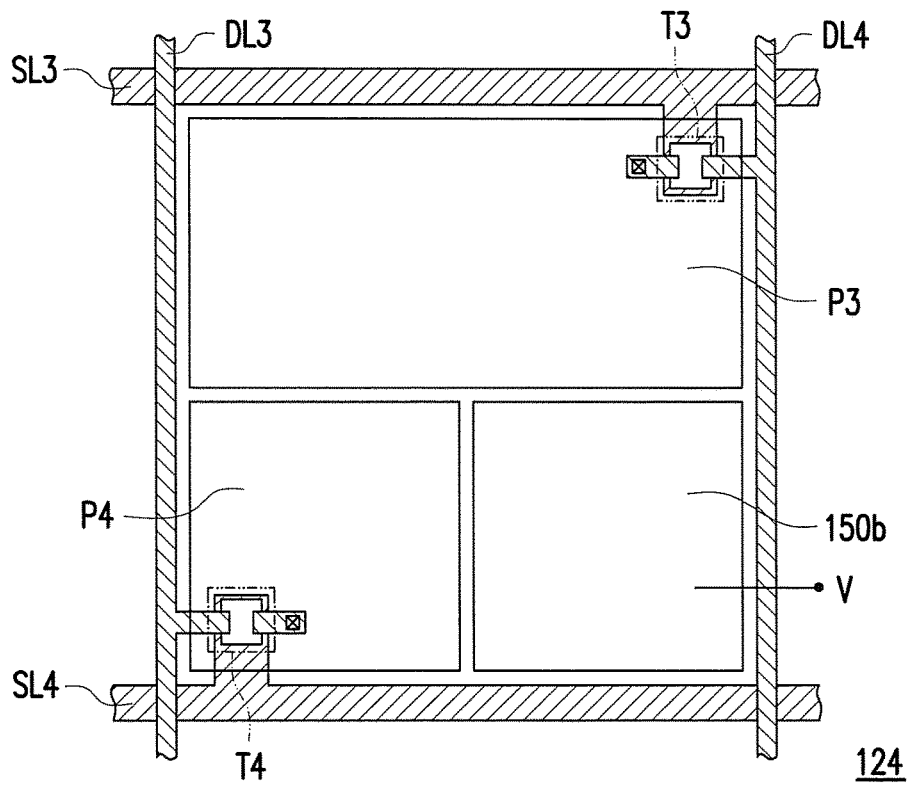

FIGS. 6A to 6C are schematic top views of, respectively, the display unit set 140, the first pixel set 114 and the second pixel set 124 according to the fourth embodiment of the invention. The embodiments of FIGS. 6A to 6C are similar to those of FIGS. 5A to 5C. Thus, the same or similar elements are represented by the same or similar reference numerals, and descriptions thereof are not repeated herein.

Referring to FIGS. 6A to 6C, the embodiments of FIGS. 6A to 6C differ from those of FIGS. 5A to 5C in that the arrangement of the second independent electrode 150b included in the second pixel set 124 is different. More specifically, in the present embodiment, the first pixel set 114 and the second pixel set 124 include the first independent electrode 150a and the second independent electrode 150b respectively, and the first independent electrode 150a and the second independent electrode 150b neither overlap nor are adjacent to each other. The first independent electrode 150a and the second independent electrode 150b are electrically connected to a constant voltage, or are respectively electrically connected to corresponding constant voltages. In other words, the first independent electrode 150a and the second independent electrode 150b may be electrically connected to the same constant voltage or different constant voltages. In this way, the first pixel electrode P1 overlaps the third pixel electrode P3 to constitute the first display unit 142a, the first pixel electrode P1 overlaps the second independent electrode 150b to constitute the second display unit 142b, the second pixel electrode P2 overlaps the fourth pixel electrode P4 to constitute the third display unit 142c, and the first independent electrode 150a overlaps the third pixel electrode P3 to constitute the fourth display unit 142d. Moreover, the sum of the area of the second pixel electrode P2 and the area of the first independent electrode 150a is equivalent to the area of the first pixel electrode P1. A sum of the area of the fourth pixel electrode P4 and the area of the second independent electrode 150b is equivalent to the area of the third pixel electrode P3.

Figure 7A:
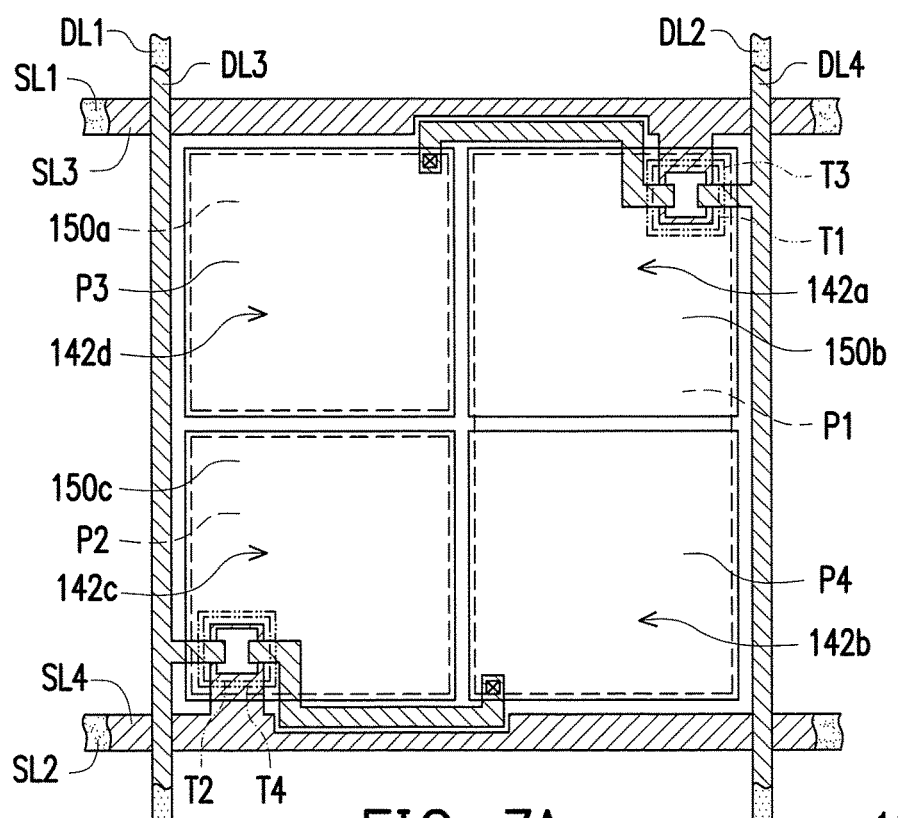
FIGS. 7A to 7C are schematic top views of respectively, a display unit set, a first pixel set and a second pixel set according to the fifth embodiment of the invention.
Figure 7B:
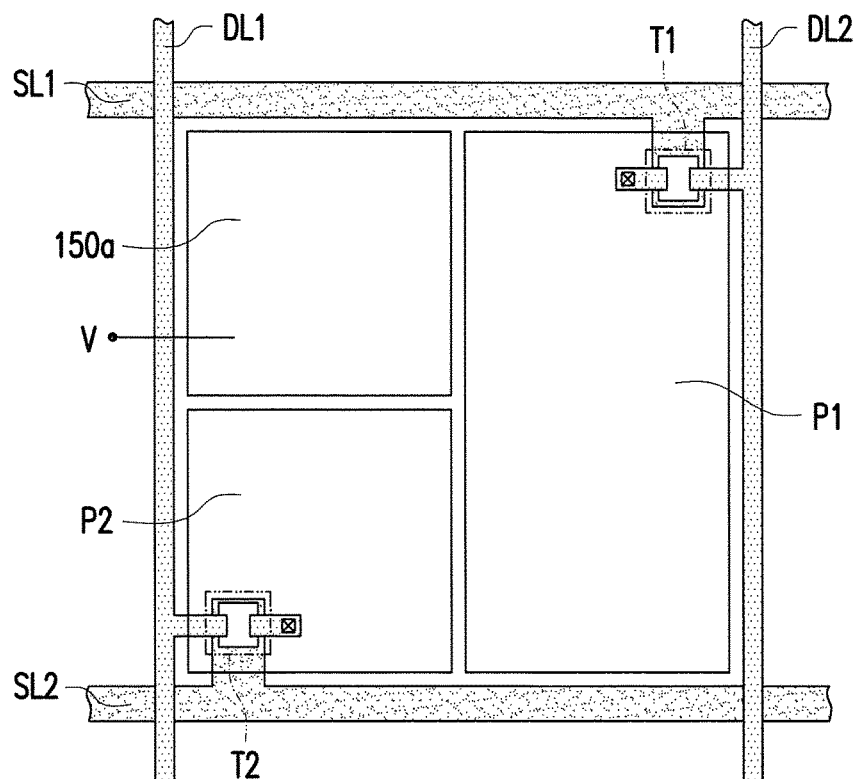
Figure 7C:
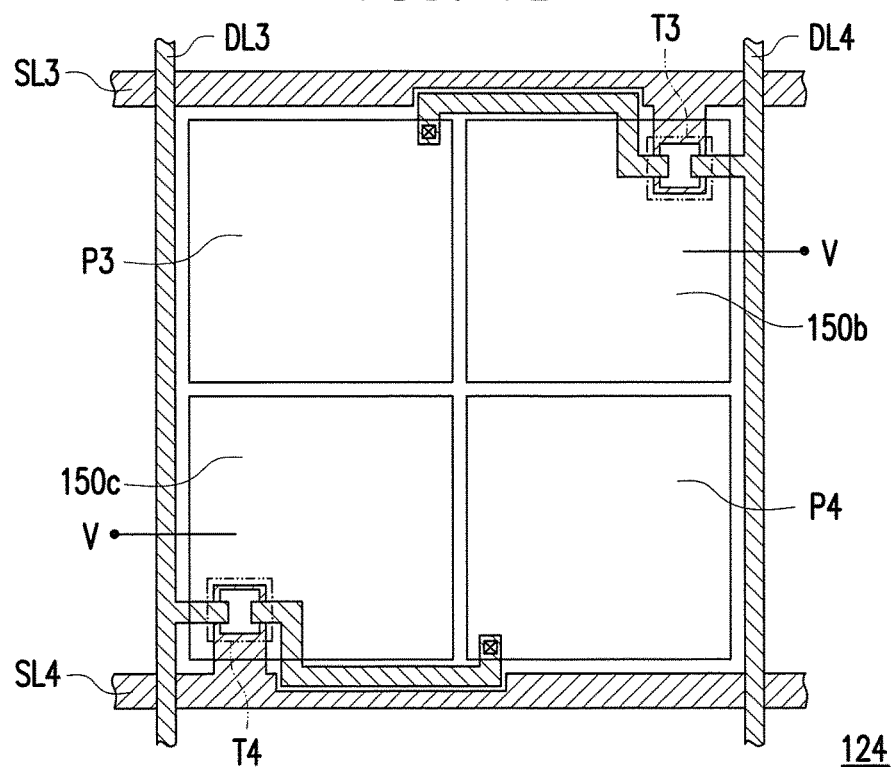

FIGS. 7A to 7C are schematic top views of, respectively, the display unit set 140, the first pixel set 114 and the second pixel set 124 according to the fifth embodiment of the invention. The embodiments of FIGS. 7A to 7C are similar to those of FIGS. 2A to 2C. Thus, the same or similar elements are represented by the same or similar reference numerals, and descriptions thereof are not repeated herein.

Referring to FIGS. 7A to 7C, the embodiments of FIGS. 7A to 7C differ from those of FIGS. 2A to 2C in that the second pixel set 124 further includes another two independent electrodes. More specifically, in the present embodiment, the first pixel set 114 includes the first independent electrode 150a, the second pixel set 124 includes the second independent electrode 150b and a third independent electrode 150c, and the first independent electrode 150a, the second independent electrode 150b and the third independent electrode 150c neither overlap nor are adjacent to one another. The first independent electrode 150a, the second independent electrode 150b and the third independent electrode 150c are electrically connected to a constant voltage, or are respectively electrically connected to corresponding constant voltages. In other words, the first independent electrode 150a, the second independent electrode 150b and the third independent electrode 150c may be electrically connected to the same constant voltage or different constant voltages. In this way, the first pixel electrode P1 overlaps the second independent electrode 150b to constitute the first display unit 142a, the first pixel electrode P1 overlaps the fourth pixel electrode P4 to constitute the second display unit 142b, the second pixel electrode P2 overlaps the third independent electrode 150c to constitute the third display unit 142c, and the first independent electrode 150a overlaps the third pixel electrode P3 to constitute the fourth display unit 142d. Moreover, the sum of the area of the second pixel electrode P2 and the area of the first independent electrode 150a is equivalent to the area of the first pixel electrode P1. The area of the third pixel electrode P3, the area of the fourth pixel electrode P4, the area of the second independent electrode 150b and an area of the third independent electrode 150c are substantially the same.

Figure 8A:
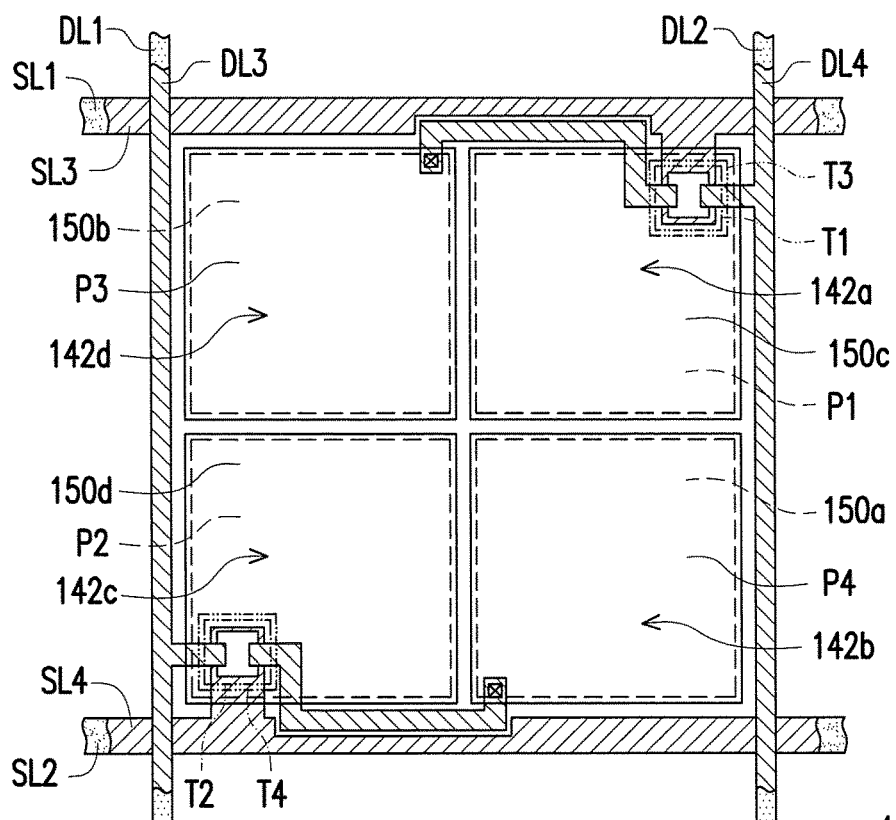
FIGS. 8A to 8C are schematic top views of, respectively, a display unit set, a first pixel set and a second pixel set according to the sixth embodiment of the invention.
Figure 8B:
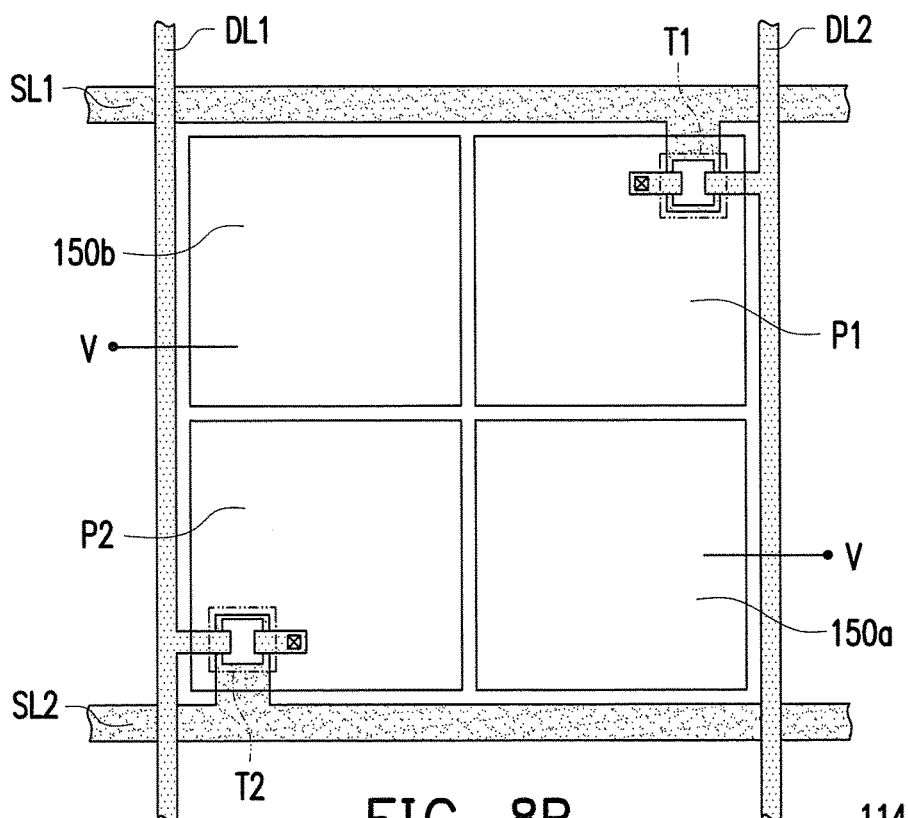
Figure 8C:
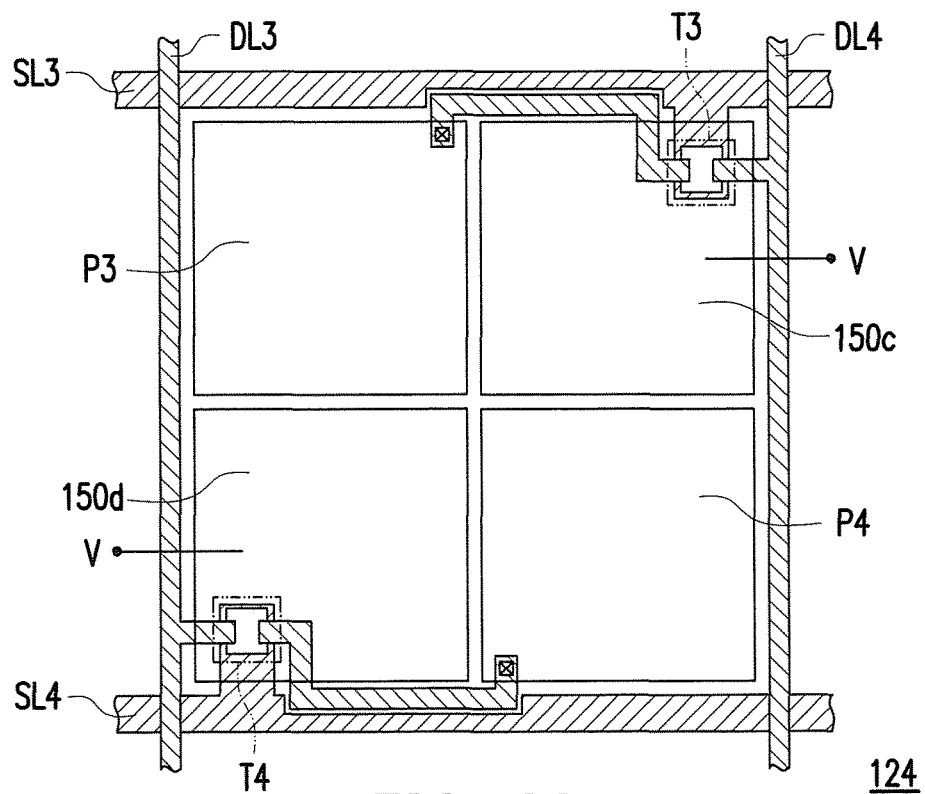

FIGS. 8A to 8C are schematic top views of, respectively, the display unit set 140, the first pixel set 114 and the second pixel set 124 according to the sixth embodiment of the invention. The embodiments of FIGS. 8A to 8C are similar to those of FIGS. 2A to 2C. Thus, the same or similar elements are represented by the same or similar reference numerals, and descriptions thereof are not repeated herein.

Referring to FIGS. 8A to 8C, the embodiments of FIGS. 8A to 8C differ from those of FIGS. 2A to 2C in that the first pixel set 114 and the second pixel set 124 each include two independent electrodes, the independent electrodes neither overlapping nor being adjacent to one another. More specifically, in the present embodiment, the first pixel set 114 includes the first independent electrode 150a and the second independent electrode 150b, and the second pixel set 124 includes the third independent electrode 150c and a fourth independent electrode 150d. The first independent electrode 150a, the second independent electrode 150b, the third independent electrode 150c and the fourth independent electrode 150d are electrically connected to a constant voltage, or are respectively electrically connected to corresponding constant voltages. In other words, the first independent electrode 150a, the second independent electrode 150b, the third independent electrode 150c and the fourth independent electrode 150d may be electrically connected to the same constant voltage or different constant voltages. In this way, the first pixel electrode P1 overlaps the third independent electrode 150c to constitute the first display unit 142a, the first independent electrode 150a overlaps the fourth pixel electrode P4 to constitute the second display unit 142b, the second pixel electrode P2 overlaps the fourth independent electrode 150d to constitute the third display unit 142c, and the second independent electrode 150b overlaps the third pixel electrode P3 to constitute the fourth display unit 142d. Moreover, the area of the first pixel electrode P1, the area of the second pixel electrode P2, the area of the first independent electrode 150a and the area of the second independent electrode 150b are substantially the same. The area of the third pixel electrode P3, the area of the fourth pixel electrode P4, the area of the third independent electrode 150c and an area of the fourth independent electrode 150d are substantially the same.

Figure 9A:
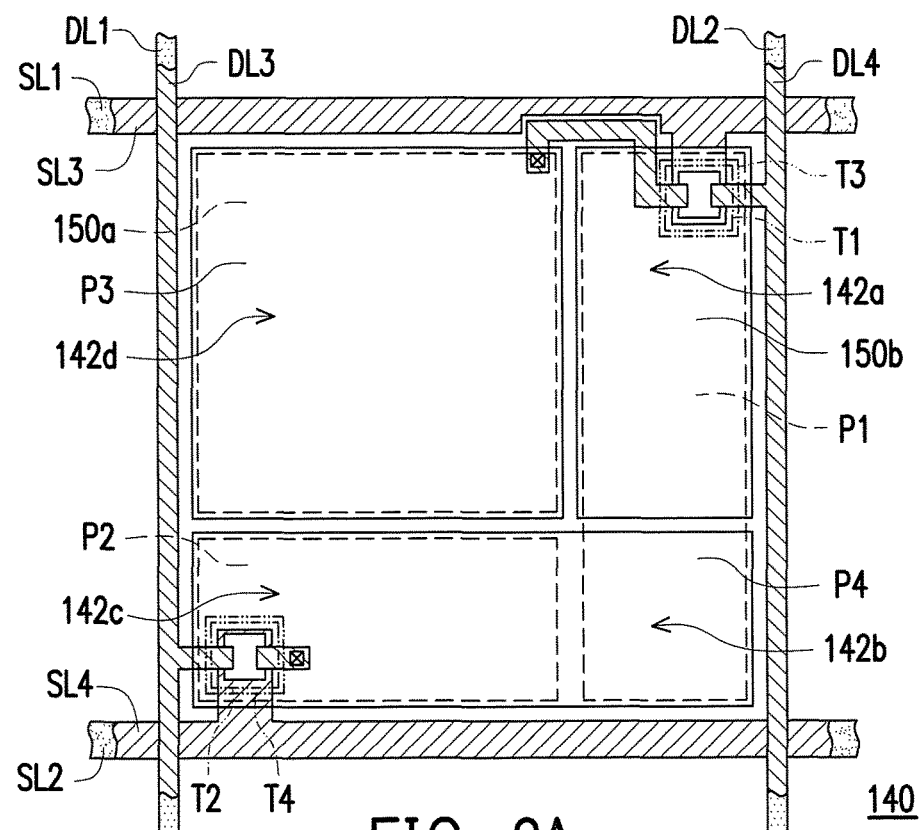
FIGS. 9A to 9C are schematic top views of, respectively, a display unit set, a first pixel set and a second pixel set according to the seventh embodiment of the invention.
Figure 9B:
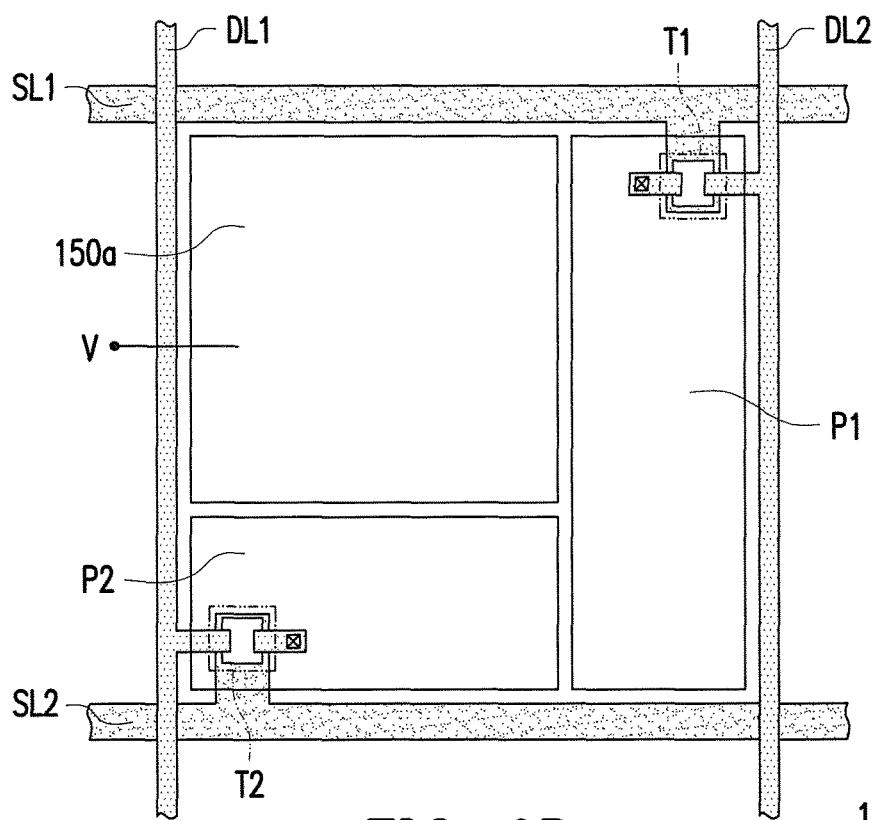
Figure 9C:
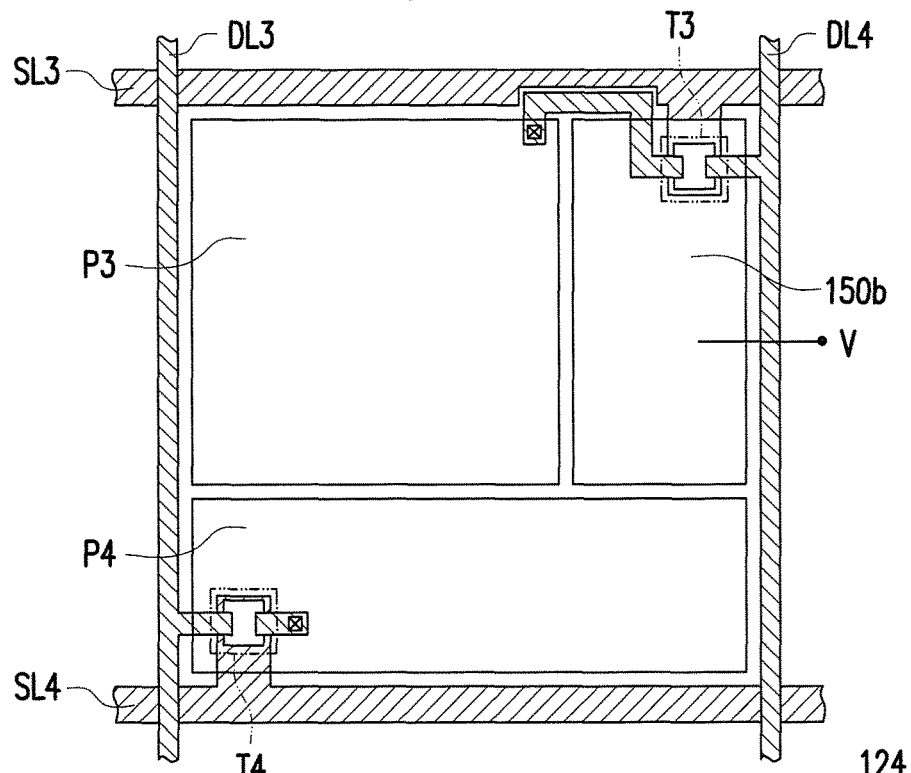

FIGS. 9A to 9C are schematic top views of, respectively, the display unit set 140, the first pixel set 114 and the second pixel set 124 according to the seventh embodiment of the invention. The embodiments of FIGS. 9A to 9C are similar to those of FIGS. 5A to 5C. Thus, the same or similar elements are represented by the same or similar reference numerals, and descriptions thereof are not repeated herein.

Referring to FIGS. 9A to 9C, the embodiments of FIGS. 9A to 9C differ from those of FIGS. 5A to 5C in that the four display units 142a to 142d have different areas. More specifically, in the present embodiment, the first pixel set 114 and the second pixel set 124 include the first independent electrode 150a and the second independent electrode 150b respectively, and the first independent electrode 150a and the second independent electrode 150b neither overlap nor are adjacent to each other. The first independent electrode 150a and the second independent electrode 150b are electrically connected to a constant voltage, or are respectively electrically connected to corresponding constant voltages. In other words, the first independent electrode 150a and the second independent electrode 150b may be electrically connected to the same constant voltage or different constant voltages. In this way, the first pixel electrode P1 overlaps the second independent electrode 150b to constitute the first display unit 142a, the first pixel electrode P1 overlaps the fourth pixel electrode P4 to constitute the second display unit 142b, the second pixel electrode P2 overlaps the fourth pixel electrode P4 to constitute the third display unit 142c, and the first independent electrode 150a overlaps the third pixel electrode P3 to constitute the fourth display unit 142d.

Figure 10A:
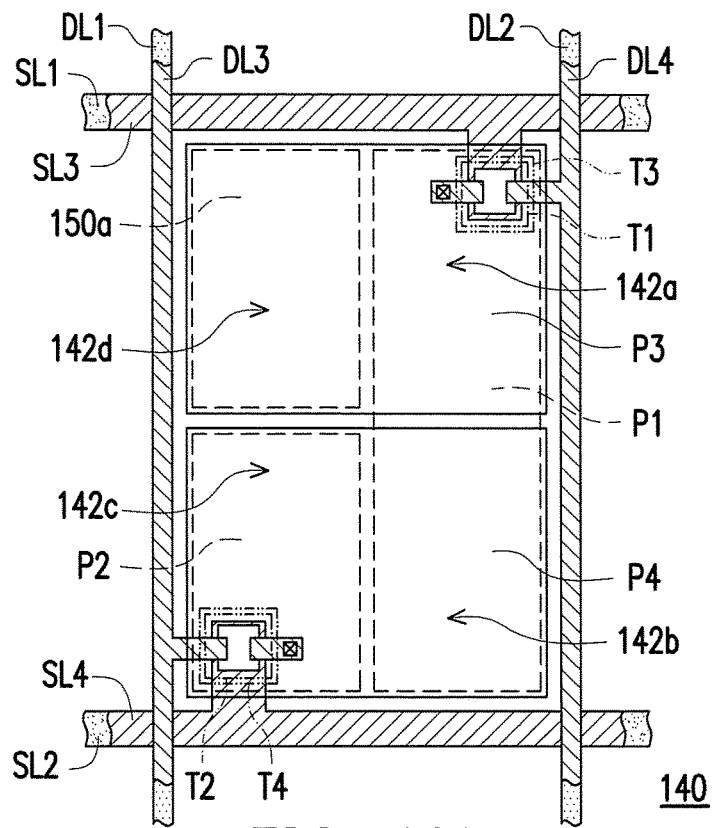
FIGS. 10A to 10C are schematic top views of, respectively, a display unit set, a first pixel set and a second pixel set according to the eighth embodiment of the invention.
Figure 10B:
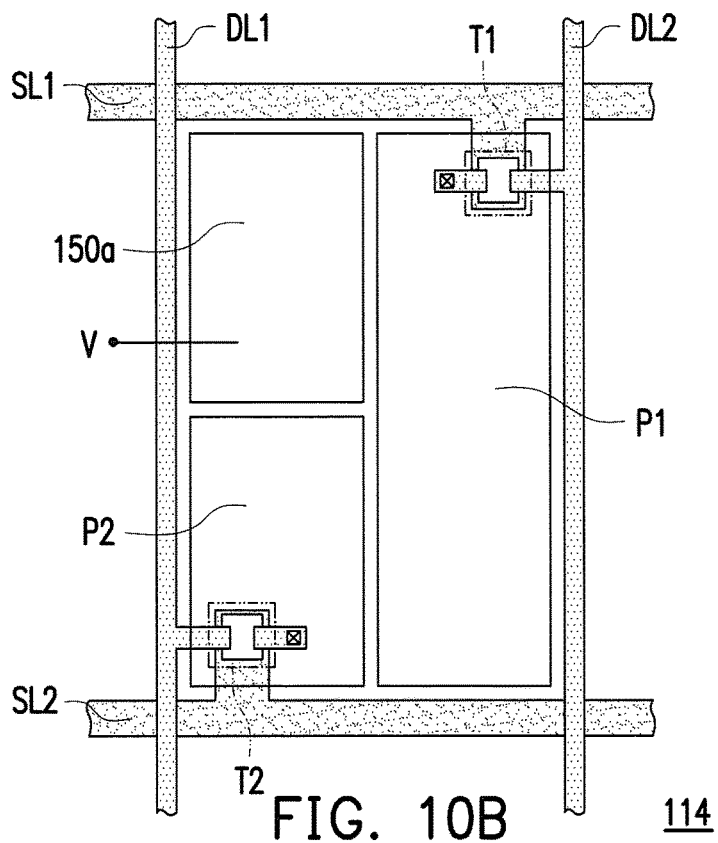
Figure 10C:
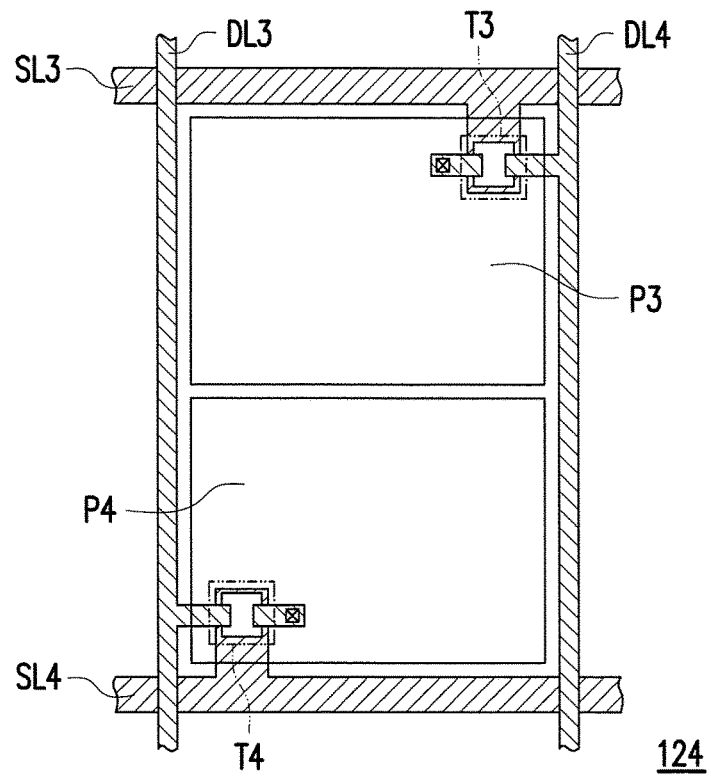

FIGS. 10A to 10C are schematic top views of, respectively, the display unit set 140, the first pixel set 114 and the second pixel set 124 according to the eighth embodiment of the invention. The embodiments of FIGS. 10A to 10C are similar to those of FIGS. 2A to 2C. Thus, the same or similar elements are represented by the same or similar reference numerals, and descriptions thereof are not repeated herein.

Referring to FIGS. 10A to 10C, the embodiments of FIGS. 10A to 10C differ from those of FIGS. 2A to 2C in that the four display units 142a to 142d are of different shapes. More specifically, in the present embodiment, the four display units 142a to 142d are of a rectangular shape.

However, the invention is not limited thereto. In other embodiments, the four display units 142a to 142d may be of other suitable shapes.

Figure 11A:
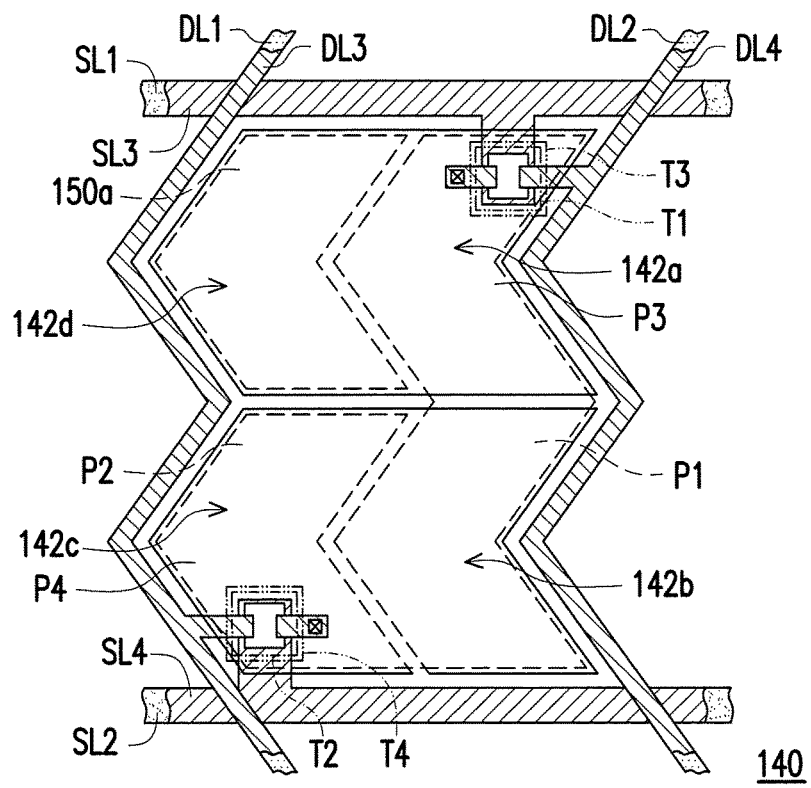
FIGS. 11A to 11C are schematic top views of respectively, a display unit set, a first pixel set and a second pixel set according to the ninth embodiment of the invention.
Figure 11B:
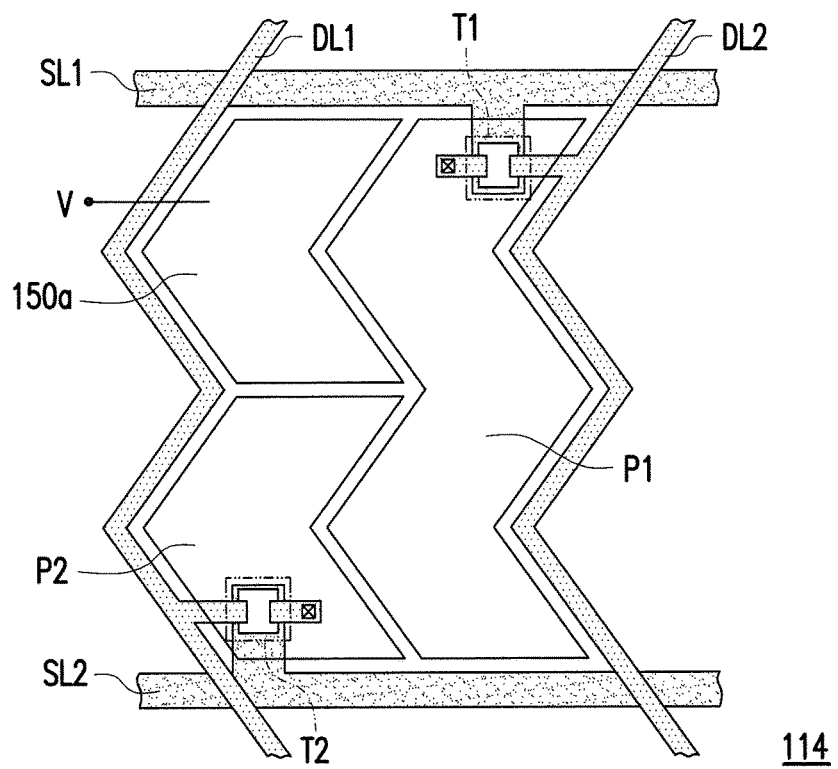
Figure 11C:
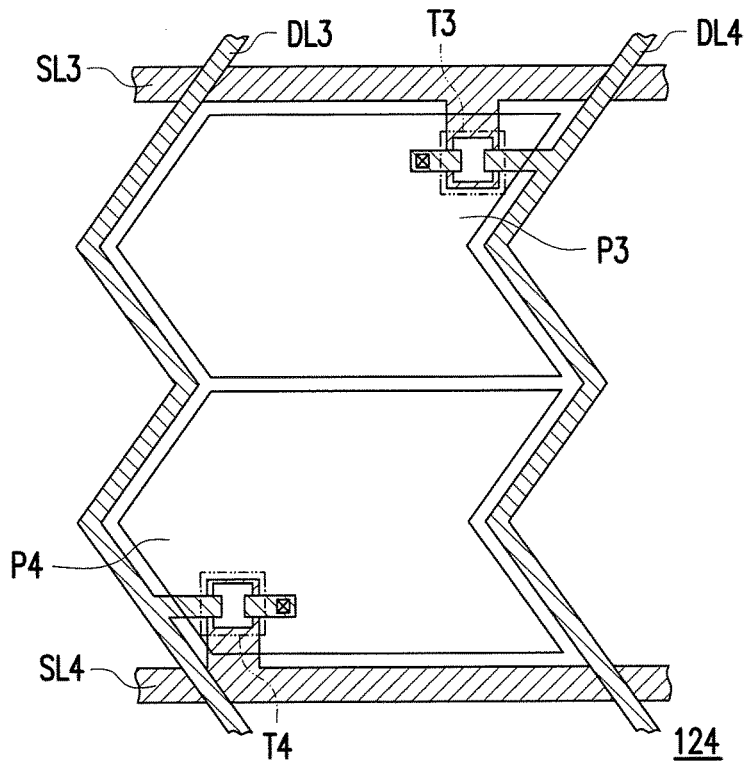

FIGS. 11A to 11C are schematic top views of, respectively, the display unit set 140, the first pixel set 114 and the second pixel set 124 according to the ninth embodiment of the invention. The embodiments of FIGS. 11A to 11C are similar to those of FIGS. 2A to 2C. Thus, the same or similar elements are represented by the same or similar reference numerals, and descriptions thereof are not repeated herein.

Referring to FIGS. 11A to 11C, the embodiments of FIGS. 11A to 11C differ from those of FIGS. 2A to 2C in that the four display units 142a to 142d are of different shapes. More specifically, in the present embodiment, the four display units 142a to 142d are of a boomerang-like shape. However, the invention is not limited thereto. In other embodiments, the four display units 142a to 142d are in an arbitrary combination of any of the aforementioned arrangements for independent electrodes and any of the aforementioned shapes of display units. In addition, the four display units 142a to 142d may be of other suitable shapes and in other suitable arrangements.

In summary, in the display unit set of the invention, each first pixel set, a second pixel set disposed overlapping the each first pixel set and the display medium located between the first pixel set and the second pixel set constitute the display unit set, and the display unit set includes a plurality of display units. Since the second pixel sets are disposed overlapping the first pixel sets, the design of the display unit set of the invention makes it possible that the display unit set constituted by the four sub-pixels only requires two active device regions on the display surface, wherein the third active device overlaps the first active device, and the fourth active device overlaps the second active device. Therefore, the design of the display unit set of the invention decreases the number of active device regions required to be disposed on the display surface, thereby increasing the pixel aperture ratio.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A display panel, comprising:
   a first substrate;
   a first pixel array disposed on the first substrate and comprising a plurality of first pixel sets, each of the first pixel sets comprises:
      a first active device and a first pixel electrode electrically connected to the first active device; and
      a second active device and a second pixel electrode electrically connected to the second active device;
      a first scan line, a second scan line, a first data line and a second data line, wherein the first active device is electrically connected to the first scan line and the second data line, and the second active device is electrically connected to the second scan line and the first data line;
   a second pixel array disposed on the first pixel array and comprising a plurality of second pixel sets, wherein the first pixel array is located in between the second pixel array and the first substrate, each of the second pixel sets comprises:
      a third active device and a third pixel electrode electrically connected to the third active device, wherein the first active device overlaps the third active device; and
      a fourth active device and a fourth pixel electrode electrically connected to the fourth active device, wherein the second active device overlaps the fourth active device;
      a third scan line, a fourth scan line, a third data line and a fourth data line, wherein the third active device is electrically connected to the third scan line and the fourth data line, and the fourth active device is electrically connected to the fourth scan line and the third data line;
   a display medium located between the first pixel array and the second pixel array and in contact with the first pixel array and the second pixel array,
   wherein each of the first pixel sets, one of the second pixel sets disposed overlapping the first pixel set and the display medium located between the first pixel set and the second pixel set constitute a display unit set, and the display unit set comprises a plurality of display units.

2. The display panel of claim 1, wherein the first pixel set further comprises an independent electrode,
   the first pixel electrode overlaps the third pixel electrode to constitute a first display unit,
   the first pixel electrode overlaps the fourth pixel electrode to constitute a second display unit,
   the second pixel electrode overlaps the fourth pixel electrode to constitute a third display unit, and
   the independent electrode overlaps the third pixel electrode to constitute a fourth display unit.

3. The display panel of claim 2, wherein the independent electrode is electrically connected to a constant voltage.

4. The display panel of claim 2, wherein a sum of an area of the second pixel electrode and an area of the independent electrode is equivalent to an area of the first pixel electrode.

5. The display panel of claim 2, wherein an area of the third pixel electrode is equivalent to an area of the fourth pixel electrode.

6. The display panel of claim 1, wherein the first pixel set further comprises a first independent electrode and a second independent electrode, and the first independent electrode and the second independent electrode are not adjacent to each other, wherein the first independent electrode and the second independent electrode are disposed to intersect with the first pixel electrode and the second pixel electrode,
   the first pixel electrode overlaps the third pixel electrode to constitute a first display unit,
   the first independent electrode overlaps the fourth pixel electrode to constitute a second display unit,
   the second pixel electrode overlaps the fourth pixel electrode to constitute a third display unit, and
   the second independent electrode overlaps the third pixel electrode to constitute a fourth display unit.

7. The display panel of claim 6, wherein the first independent electrode and the second independent electrode are electrically connected to a constant voltage or are respectively electrically connected to corresponding constant voltages.

8. The display panel of claim 6, wherein an area of the first pixel electrode, an area of the second pixel electrode, an area of the first independent electrode and an area of the second independent electrode are substantially the same.

9. The display panel of claim 6, wherein an area of the third pixel electrode is equivalent to an area of the fourth pixel electrode.

10. The display panel of claim 1, wherein the first pixel set comprises a first independent electrode, the second pixel set comprises a second independent electrode, and the first independent electrode and the second independent electrode do not overlap each other,
the first pixel electrode overlaps the second independent electrode to constitute a first display unit,
the first pixel electrode overlaps the fourth pixel electrode to constitute a second display unit,
the second pixel electrode overlaps the fourth pixel electrode to constitute a third display unit, and
the first independent electrode overlaps the third pixel electrode to constitute a fourth display unit.

11. The display panel of claim 10, wherein the first independent electrode and the second independent electrode are electrically connected to a constant voltage or are respectively electrically connected to corresponding constant voltages.

12. The display panel of claim 10, wherein a sum of an area of the first independent electrode and an area of the second pixel electrode is equivalent to an area of the first pixel electrode.

13. The display panel of claim 10, wherein a sum of an area of the third pixel electrode and an area of the second independent electrode is equivalent to an area of the fourth pixel electrode.

14. The display panel of claim 1, wherein the first pixel set comprises a first independent electrode, the second pixel set comprises a second independent electrode, and the first independent electrode and the second independent electrode neither overlap nor are adjacent to each other,
the first pixel electrode overlaps the third pixel electrode to constitute a first display unit,
the first pixel electrode overlaps the second independent electrode to constitute a second display unit,
the second pixel electrode overlaps the fourth pixel electrode to constitute a third display unit, and
the first independent electrode overlaps the third pixel electrode to constitute a fourth display unit.

15. The display panel of claim 14, wherein the first independent electrode and the second independent electrode are electrically connected to a constant voltage or are respectively electrically connected to corresponding constant voltages.

16. The display panel of claim 14, wherein a sum of an area of the first independent electrode and an area of the second pixel electrode is equivalent to an area of the first pixel electrode.

17. The display panel of claim 14, wherein a sum of an area of the fourth pixel electrode and an area of the second independent electrode is equivalent to an area of the third pixel electrode.

18. The display panel of claim 1, wherein the first pixel set further comprises a first independent electrode, the second pixel set further comprises a second independent electrode and a third independent electrode, and the first independent electrode, the second independent electrode and the third independent electrode neither overlap nor are adjacent to one another, wherein the second independent electrode and the third independent electrode are disposed to intersect with the third pixel electrode and the fourth pixel electrode,
the first pixel electrode overlaps the second independent electrode to constitute a first display unit,
the first pixel electrode overlaps the fourth pixel electrode to constitute a second display unit,
the second pixel electrode overlaps the third independent electrode to constitute a third display unit, and
the first independent electrode overlaps the third pixel electrode to constitute a fourth display unit.

19. The display panel of claim 18, wherein the first independent electrode, the second independent electrode and the third independent electrode are electrically connected to a constant voltage or are respectively electrically connected to corresponding constant voltages.

20. The display panel of claim 18, wherein a sum of an area of the first independent electrode and an area of the second pixel electrode is equivalent to an area of the first pixel electrode.

21. The display panel of claim 18, wherein an area of the third pixel electrode, an area of the fourth pixel electrode, an area of the second independent electrode and an area of the third independent electrode are substantially the same.

22. The display panel of claim 1, wherein the first pixel set further comprises a first independent electrode and a second independent electrode, the second pixel set further comprises a third independent electrode and a fourth independent electrode, and the first independent electrode, the second independent electrode, the third independent electrode and the fourth independent electrode neither overlap nor are adjacent to one another, wherein the first independent electrode and the second independent electrode are disposed to intersect with the first pixel electrode and the second pixel electrode, and wherein the third independent electrode and the fourth independent electrode are disposed to intersect with the third pixel electrode and the fourth pixel electrode,
the first pixel electrode overlaps the third independent electrode to constitute a first display unit,
the first independent electrode overlaps the fourth pixel electrode to constitute a second display unit,
the second pixel electrode overlaps the fourth independent electrode to constitute a third display unit, and
the second independent electrode overlaps the third pixel electrode to constitute a fourth display unit.

23. The display panel of claim 22, wherein the first independent electrode, the second independent electrode, the third independent electrode and the fourth independent electrode are electrically connected to a constant voltage or are respectively electrically connected to corresponding constant voltages.

24. The display panel of claim 22, wherein an area of the first pixel electrode, an area of the second pixel electrode, an area of the first independent electrode and an area of the second independent electrode are substantially the same.

25. The display panel of claim 22, wherein an area of the third pixel electrode, an area of the fourth pixel electrode, an area of the third independent electrode and an area of the fourth independent electrode are substantially the same.

26. The display panel of claim 1, wherein the first scan line overlaps the third scan line, and the second scan line overlaps the fourth scan line.

27. The display panel of claim 1, wherein the first data line overlaps the third data line, and the second data line overlaps the fourth data line.

28. The display panel of claim 1, wherein each of the first pixel sets or each of the second pixel sets further comprises at least one independent electrode.

29. The display panel of claim 1, wherein each of the first pixel sets or each of the second pixel sets further comprises at least two independent electrodes, and the independent electrodes are not adjacent to each other.

* * * * *